(12) United States Patent
Shido

(10) Patent No.: US 10,424,354 B2
(45) Date of Patent: *Sep. 24, 2019

(54) STACK ACCESS CONTROL FOR MEMORY DEVICE

(71) Applicant: MICRON TECHNOLOGY, INC., Boise, ID (US)

(72) Inventor: Taihei Shido, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/380,285

(22) Filed: Apr. 10, 2019

(65) Prior Publication Data

US 2019/0237116 A1 Aug. 1, 2019

Related U.S. Application Data

(63) Continuation of application No. 16/133,576, filed on Sep. 17, 2018, now Pat. No. 10,304,505, which is a continuation of application No. 15/176,442, filed on Jun. 8, 2016, now Pat. No. 10,079,049.

(51) Int. Cl.
*G11C 7/22* (2006.01)
*G11C 7/10* (2006.01)
*G06F 13/16* (2006.01)

(52) U.S. Cl.
CPC .............. *G11C 7/22* (2013.01); *G06F 13/16* (2013.01); *G11C 7/10* (2013.01); *G11C 7/109* (2013.01); *G11C 7/1069* (2013.01); *G11C 7/1096* (2013.01)

(58) Field of Classification Search
CPC .................................. G11C 7/22; G06F 13/26

USPC ........................................................ 365/194
See application file for complete search history.

(56) References Cited

U.S. PATENT DOCUMENTS

| | | |
|---|---|---|
| 10,079,049 B2 | 9/2018 | Shido |
| 2003/0145145 A1 | 7/2003 | Muroor et al. |
| 2008/0028137 A1 | 1/2008 | Schakel et al. |
| 2011/0085403 A1 | 4/2011 | Nishioka et al. |
| 2012/0008436 A1 | 1/2012 | Rajan et al. |
| 2012/0263003 A1 | 10/2012 | Sakakibara et al. |

(Continued)

OTHER PUBLICATIONS

U.S. Appl. No. 15/808,771, entitled 'Apparatuses and Methods for Repairing Memory Devices Including a Plurality of Memory Die and an Interface,' filed Nov. 9, 2017, pp. all.

(Continued)

*Primary Examiner* — Hoai V Ho
*Assistant Examiner* — Muna A Techane
(74) *Attorney, Agent, or Firm* — Dorsey & Whitney LLP

(57) ABSTRACT

Apparatuses and methods including an interface die that interfaces with dice through memory channels are described. An example apparatus includes a first die. The first die receives a first command including first command information and second command information provided after the first command information. The first die changes an order of providing the first command information and the second command information and provides a second command to a second die, the second command including the second command information and the first command information provided after the second command information in the changed order. The first command information is related to a command function and the second command information is related to a destination of the command function.

20 Claims, 19 Drawing Sheets

(56) References Cited

U.S. PATENT DOCUMENTS

| | | |
|---|---|---|
| 2013/0153898 A1 | 6/2013 | Takahashi et al. |
| 2013/0159587 A1 | 6/2013 | Nygren et al. |
| 2013/0339820 A1 | 12/2013 | Cordero et al. |
| 2014/0006699 A1 | 1/2014 | Bains et al. |
| 2015/0162068 A1 | 6/2015 | Woo et al. |
| 2017/0125119 A1 | 5/2017 | Loh et al. |
| 2017/0358336 A1 | 12/2017 | Shido |
| 2019/0035442 A1 | 1/2019 | Shido |

OTHER PUBLICATIONS

U.S. Appl. No. 16/352,743, titled "Apparatuses and Methods for Repairing Memory Devices Including a Plurality of Memory Die and an Interface", filed Mar. 13, 2019, pp. all.

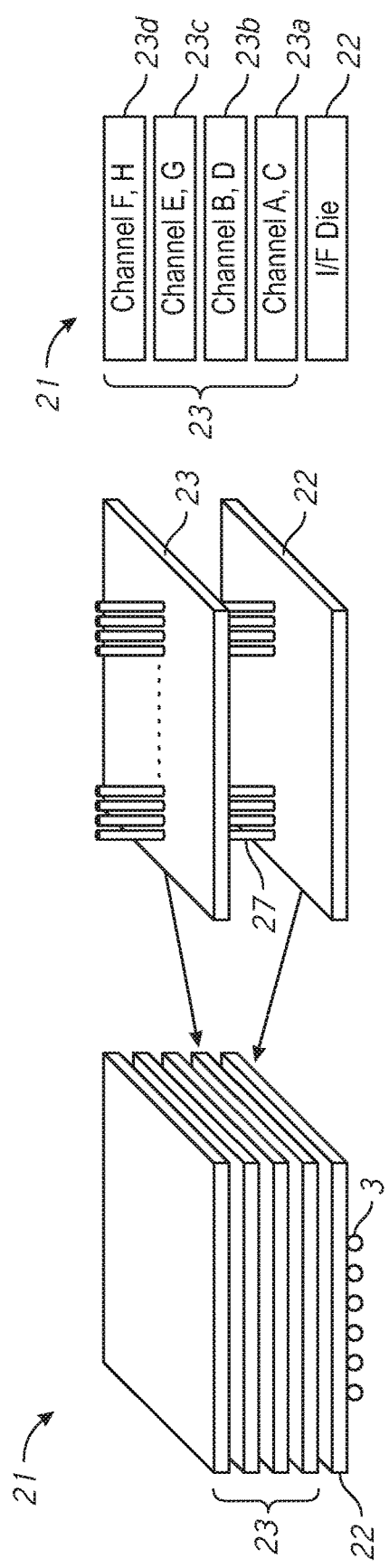

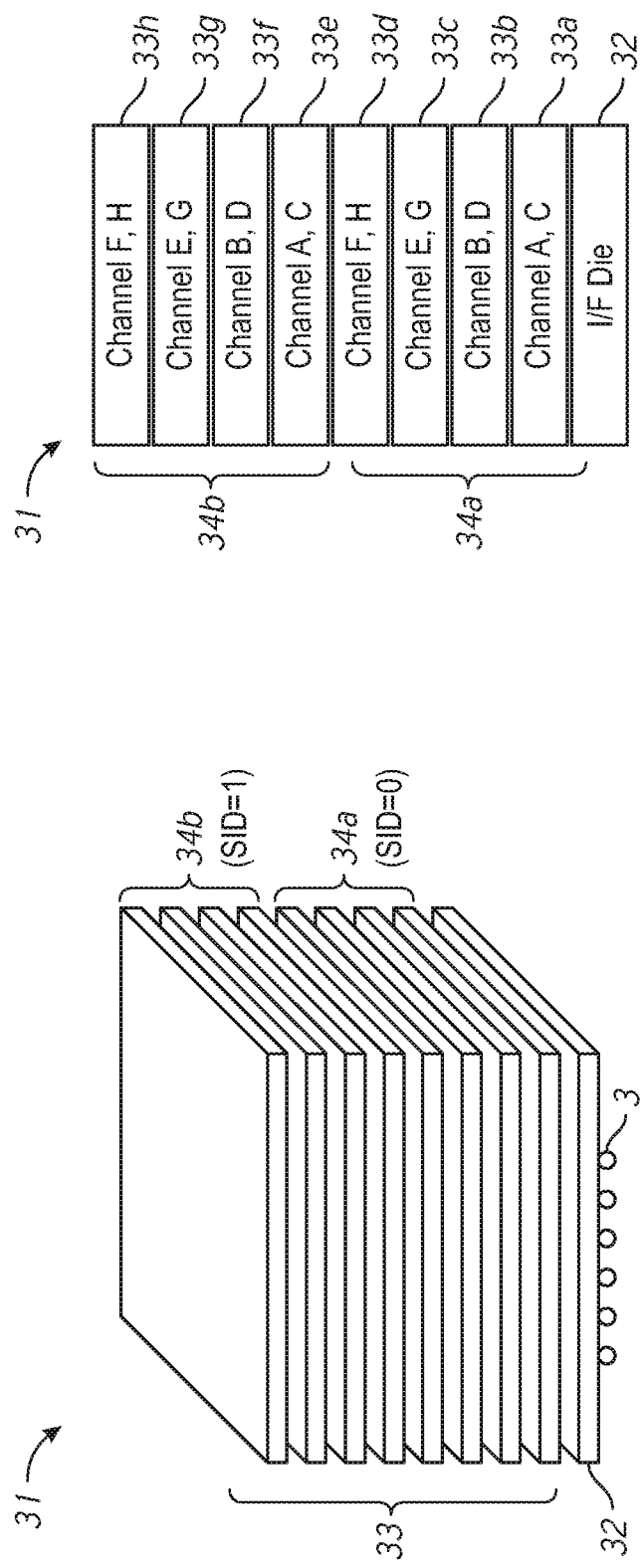

Row Commands Truth Table

| FUNCTION | SYMBOL | CLOCK CYCLE | CKE (N-1) | CKE N | R[0] | R[1] | R[2] | R[3] | R[4] | R[5] |
|---|---|---|---|---|---|---|---|---|---|---|
| Row No Operation | RNOP | Rising | H | H | H | H | H | V | V | V |
|  |  | Falling |  |  | V | V | PAR | V | V | V |
| Activate | ACT | Rising | H | H | RA11 | RA12 | RA14/SID | RA15/BA4 | RA13 | BA2 |
|  |  | Falling |  |  | RA5 | RA6 | RA7 | RA8 | RA9 | RA10 |
|  |  | Rising |  |  | RA0 | RA1 | PAR | RA2 | RA3 | RA4 |
|  |  | Falling |  |  |  |  |  |  |  |  |
| Precharge | PRE | Rising | H | H | H | H | L | BA0 | BA1 | BA2 |
|  |  | Falling |  |  | V | V/SID | PAR | BA4 | BA3 | BA3 |
| Precharge All | PREA | Rising | H | H | H | H | L | V | L | V |
|  |  | Falling |  |  | V | V | PAR | V | V | V |
| Single Bank Refresh | REFSB | Rising | H | H | L | V/SID | H | BA0 | BA1 | BA2 |
|  |  | Falling |  |  | V | V | PAR | BA4 | L | BA3 |
| Refresh | REF | Rising | H | H | L | L | H | BA0 | L | V |
|  |  | Falling |  |  | V | V | PAR | BA4 | V | V |
| Power Down Entry | PDE | Rising | H | L | L | H | H | V | H | V |
|  |  | Falling |  |  | V | V | PAR | V | V | V |
| Self Refresh Entry | SRE | Rising | H | L | H | H | H | V | V | V |
|  |  | Falling |  |  | V | V | PAR | V | V | V |
| Power Down & Self Refresh Exit | PDX/SRX | Rising | L | H | H | H | H | V | V | V |
|  |  | Falling |  |  | V | V | V | V | V | V |

FIG. 5

Column Commands Truth Table

| FUNCTION | SYMBOL | CLOCK CYCLE | CKE (n-1) | CKE n | C[0] | C[1] | C[2] | C[3] | C[4] | C[5] | C[6] | C[7] |
|---|---|---|---|---|---|---|---|---|---|---|---|---|
| Column No Operation | CNOP | Rising | H | H | H | H | H | V | V | V | V | V |
|  |  | Falling |  |  | V | V | V | V | V | V | V | V |
| Read | RD | Rising | H | H | H | L | H | L | BA0 | BA1 | BA2 | BA3 |
|  |  | Falling |  |  | CA0/V/SID | CA1 | PAR | CA2 | CA3 | CA4 | CA5 | CA6/BA4 |
| Read w/ AP | RDA | Rising | H | H | H | L | H | H | BA0 | BA1 | BA2 | BA3 |
|  |  | Falling |  |  | CA0/V/SID | CA1 | PAR | CA2 | CA3 | CA4 | CA5 | CA6/BA4 |
| Write | WR | Rising | H | H | H | L | L | L | BA0 | BA1 | BA2 | BA3 |
|  |  | Falling |  |  | CA0/V/SID | CA1 | PAR | CA2 | CA3 | CA4 | CA5 | CA6/BA4 |
| Write w/ AP | WRA | Rising | H | H | H | L | L | H | BA0 | BA1 | BA2 | BA3 |
|  |  | Falling |  |  | CA0/V/SID | CA1 | PAR | CA2 | CA3 | CA4 | CA5 | CA6/BA4 |
| Mode Register Set | MRS | Rising | H | H | L | L | L | OP7 | BA0 | BA1 | BA2 | BA3 |
|  |  | Falling |  |  | OP0 | OP1 | PAR | OP2 | OP3 | OP4 | OP5 | OP6 |

FIG. 6

STACK ACCESS CONTROL FOR MEMORY DEVICE

CROSS-REFERENCE TO RELATED APPLICATION(S)

This application is a continuation of U.S. patent application Ser. No. 16/133,576 filed Sep. 17, 2018 and issued as U.S. Pat. No. 10,304,505 on May 28, 2019, which is a continuation of U.S. patent application Ser. No. 15/176,442, filed Jun. 8, 2016 and issued as U.S. Pat. No. 10,079,049 on Sep. 18, 2018. The aforementioned applications, and issued patents, are incorporated by reference herein, in its entirety, and for any purposes.

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking dice vertically and interconnecting the dice using through-silicon (or through-substrate) vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC) and High Bandwidth Memory (HBM).

For example, High Bandwidth Memory (HBM) is a type of memory including a high-performance random access memory (DRAM) interface and vertically stacked DRAM. FIG. 1 is a wiring diagram of a High Bandwidth Memory (HBM) 1 and a processor 2. For example, the processor 2 may be a graphical processor unit. The HBM 1 may include terminals coupled by balls 3 (e.g., microbumps) to an interposer 5. The processor 2 may include terminals coupled by balls 4 (e.g., microbumps) to the interposer 5 and further to the corresponding terminals of the HBM 1 through the interposer 5. The interposer may be stacked on a packaging substrate (not shown) by balls 6. For example, the interposer 5 may be made of silicon.

FIG. 2A is a schematic diagram of an HBM stack including an interface (I/F) die 22 and a plurality of core dies 23. For example, the number of the plurality of core dies 23 in the HBM stack 21 may be four. FIG. 2B is a schematic diagram of a portion of the HBM stack 21. The I/F die 22 and the plurality of core dies 23 may be coupled by a plurality of conductive vias 27 (e.g., through silicon (substrate) via (TSV)). The I/F die 22 may be on the balls 3. For example, a combination of the conductive vias 27 and the balls 3 may function as interconnects. FIG. 2C is a schematic diagram of the HBM stack 21 including the I/F die 22 and the plurality of core dies 23. The HBM stack 21 may have two 128-bit channels per core die for a total of eight input/output channels and a width of 1024 bits in total. For example, each core die of the plurality of the core dies 23 may include two channels. In this example, the core dies 23a, 23b, 23c and 23d include channels A and C, channels B and D, channels E and G, and channels F and H, respectively. For example, a clock frequency, a command sequence, and data can be independently provided for each channel.

FIG. 4A is a wiring diagram of the HBM stack 21 including the I/F die 22 and the plurality of core dies 23. The I/F die 22 of the HBM 21 provides interfaces 28a, 28b, 28e and 28f which provide signals on four input/output channels among the eight input/output channels, which function independently of each other. Memory arrays of the channel A, channel B, channel E and channel F of the core dies 23a, 23b, 23c and 23d may be coupled to the I/F die 22 via native input/output lines (IOs) 27a, 27b, 27e and 27f, respectively. For example, the native IOs 27a to 27f may be implemented as conductive vias. For example, the conductive vias may have a spiral structure. Each core die 23 may include a command circuit for each channel. For example, the core dies 23a to 23d may include command circuits 26a to 26d for channel A, channel B, channel E and channel F, respectively. Thus, clock signals, command signals and data signals for each channel may be transmitted independently and a plurality of data buses and their respective channels can operate individually.

FIG. 3A is a schematic diagram of an HBM stack 31 including an interface (I/F) die 32 and a plurality of core dies 33. For example, the number of the plurality of core dies 33 in the HBM stack 31 may be eight. FIG. 3B is a schematic diagram of the HBM stack 31 including the I/F die 32 and the plurality of core dies 33. The HBM stack 31 may have two 128-bit channels per core die for a total of eight input/output channels and a width of 1024 bits in total. For example, each core die of the plurality of the core dies 33 may include two channels. In this example, a stack group 34a having a stack identifier (SID) "0" includes the core dies 33a, 33b, 33c and 33d including channels A and C, channels B and D, channels E and G, and channels F and H, respectively. A stack group 34b having a stack ID (SID) "1" includes the core dies 33e, 33f, 33g and 33h including channels A and C, channels B and D, channels E and G, and channels F and H, respectively. Thus, a destination die among a plurality of core dies in each channel (e.g., core dies 33a and 33e of channel A) addressed in a command may be identified by the SID.

FIG. 4B is a wiring diagram of the HBM stack 31 including the I/F die 32 and the plurality of core dies 33. The I/F die 32 of the HBM 31 provides interfaces 38a, 38b, 38e and 38f which provide signals on four input/output channels among the eight input/output channels of two stack groups. Memory arrays of channels A, B. E and F of the stack group 34a and memory arrays of channels A, B, E and F of the stack group 34b may be coupled to the same native input/output lines (IOs) 37a, 37b, 37e and 37f, respectively. For example, memory arrays of channel A of the core die 33a in the stack group 34a and memory arrays of channel A of the core die 33e in the stack group 34b may be coupled to the native IO 37a. Each core die 33 may include a command circuit for each channel. For example, the core dies 33a to 33d in the stack group 34a may include command circuits 36a to 36d for channel A, channel B, channel E and channel F, respectively. The core dies 33e to 33h in the stack group 34b may include command circuits 36e to 36h for channel A, channel B, channel E and channel F, respectively. Each command circuit 36 may detect the SID in a command, check whether the SID in the command matches with an SID of the stack group of the core die 33 including the command circuit 36, and decode the command if the SID matches and memory access actions responsive to the command may be performed. For example, when the interface 38a transmits a command on the input/output line 37a, the command circuit 36a receives the command and check whether the SID in the command is "0". The command circuit 36a processes the command if the SID is "0" and ignores the command if the SID is "1". The command circuit 36e also receives the command and check whether the SID in the command is "1". The command circuit 36e processes the command if the SID is "1" and ignores the command if the SID is "0". Thus, clock signals, command signals and data signals for each channel on each die may be transmitted independently.

FIG. 5 is a command truth table of various combinations of a clock cycle, a clock enable signal, row command/address signals to be provided to the HBM 1. For example, a command circuit for each channel on each die may receive a plurality of row command/address signals R[5:0], the CKE signal and the clock signals. In the command truth table, "H" represents a logic high signal, "L" represents a logic low signal, RA[15:0] represents a row address, BA[3:0]represents a bank address, "PAR" represents parity information, and "V" represents a corresponding bit that can be either "H" or "L" which is a defined logic high or low level. Functions of row commands may include Row No Operation (RNOP), Activate (ACT), Precharge (PRE), Precharge All (PREA), Single Bank Refresh (REFSB); Refresh (REF), Power Down Entry (PDE), Self Refresh Entry (SRE) and Power Down & Self Refresh Exit (PDX/SRX). The SID may be provided at a rising edge of the ACT command, at a falling edge of R[1] of the PRE command or the REFSB command.

FIG. 6 is a command truth table of various combinations of a clock cycle, a clock enable signal, column command/address signals to be provided to the HBM 1. Description of components corresponding to components included in and previously described with reference to FIG. 5 will not be repeated. For example, a command circuit for each channel on each die may receive a plurality of column command/address signals C[7:0], the CKE signal and the clock signals. In the command truth table, CA[6:0] represents a column address and OP[6:0] represents operands to be written. Functions of column commands may include Column No Operation (CNOP), Read (RD), Read w/AP (RDA); Write (WR), Write w/AP (WRA), and Mode Register Set (MRS). As shown in FIG. 6, the SID may be provided at a falling edge of R[1] of the RD command, the RDA command, the WR command, or the WRA command. The RDA command or WDA command with auto-precharge may be used when an auto-precharge occurs to a bank associated with the command. As shown in FIGS. 5 and 6, the CKE signal is active (e.g., "H") while a command is being provided. As earlier mentioned, each command circuit may detect the SID in a command, and check whether the SID in the command matches with an SID of the stack group of the core die of the command circuit. The SID may be included in the falling edge of the clock cycle of the commands (e.g., PRE, REFSB, RD, RDA, WR and WRA). For example, as shown in FIG. 4B, when the interface 38a transmits a command on the input/output channel 37a, the command circuit 36a receives the command and checks whether the SID in the command is "0" or "1".

FIG. 7 is a timing diagram of clock signals and command signals to be provided to a portion of dies in the HBM stack 31. For example, the portion of dies may be an I/F die 32 die, Core 1 die 33a, and Core 5 die 33e in FIG. 4B. For example, the timing diagram of FIG. 7 includes a clock signal CK_t and column command signals C[7:0] received at the I/F die 32, a clock signal CK_t_0 and column command signals C_0[7:0] received at the Core 1 die 33a which processes a command for channel A in a stack group with SID="0", and a clock signal CK_t_1 and column command signals C_1[7:0] received at the Core 5 die 33e which processes a command for channel A in a stack group with SID="1". The I/F die 32 receives a command from a first clock cycle of the clock signal CK_t at time T0. The I/F die 32 may capture an SID included in the command at a falling edge of the first clock cycle of the CK_t signal at time T1. The Core 1 die 33a may capture the SID at a falling edge of a first clock cycle of the CK_t_0 signal at time T2. The core 5 die 33e receives the SID at a falling edge of a first clock cycle of the CK_t_1 signal at a time T3. There may be a propagation delay from the I/F die 32 to the Core 1 die 33a represented by "T2–T1." There may be a propagation delay from the Core 1 die 33a to the Core 5 die 33e represented by "T3–T2." The command circuits 36a and 36e Core 1 die 33a and the Core 5 die 33e wait for the SID until the falling edge of the first clock cycle and determine whether the SID corresponds to the core die of the command circuit. When a command is issued to the Core 1 die 33a, the command related signals may be transmitted to the Core 5 die 33e, because the Core 1 die 33a may capture the SID at time T2 after the first clock cycle of the commands for the Core 5 die 33e may be transmitted. The command circuit 36a of the Core 1 die 33a may not be able to determine whether the command is for the Core 1 die 33a or for the Core 5 die 33e until capturing the SID. The command circuit 36e of the Core 5 die 33e may not be able to determine whether the command is for the Core 5 die 33e until capturing the SID. If the propagation delay may be about half a clock cycle, the SID may be captured by the command circuit 36e about a propagation delay of a clock cycle. Thus, command signals unnecessary for the Core 5 die 33e may be transmitted until the SID is captured at time T3.

BRIEF DESCRIPTION OF THE DRAWINGS

FIG. 2A is a schematic diagram of an HBM stack including an interface (I/F) die and a plurality of core dies.

FIG. 2B is a schematic diagram of a portion of the HBM stack.

FIG. 2C is a schematic diagram of the HBM stack including the I/F die and the plurality of core dies.

FIG. 3A is a schematic diagram of an HBM stack including an interface (I/F) die and a plurality of core dies.

FIG. 3B is a schematic diagram of the HBM stack including the I/F die and the plurality of core dies.

FIG. 5 is a command truth table of various combinations of a clock cycle, a clock enable signal, row command/address signals to be provided to the HBM.

FIG. 6 is a command truth table of various combinations of a clock cycle, a clock enable signal, column command/address signals to be provided to the HBM.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 8:
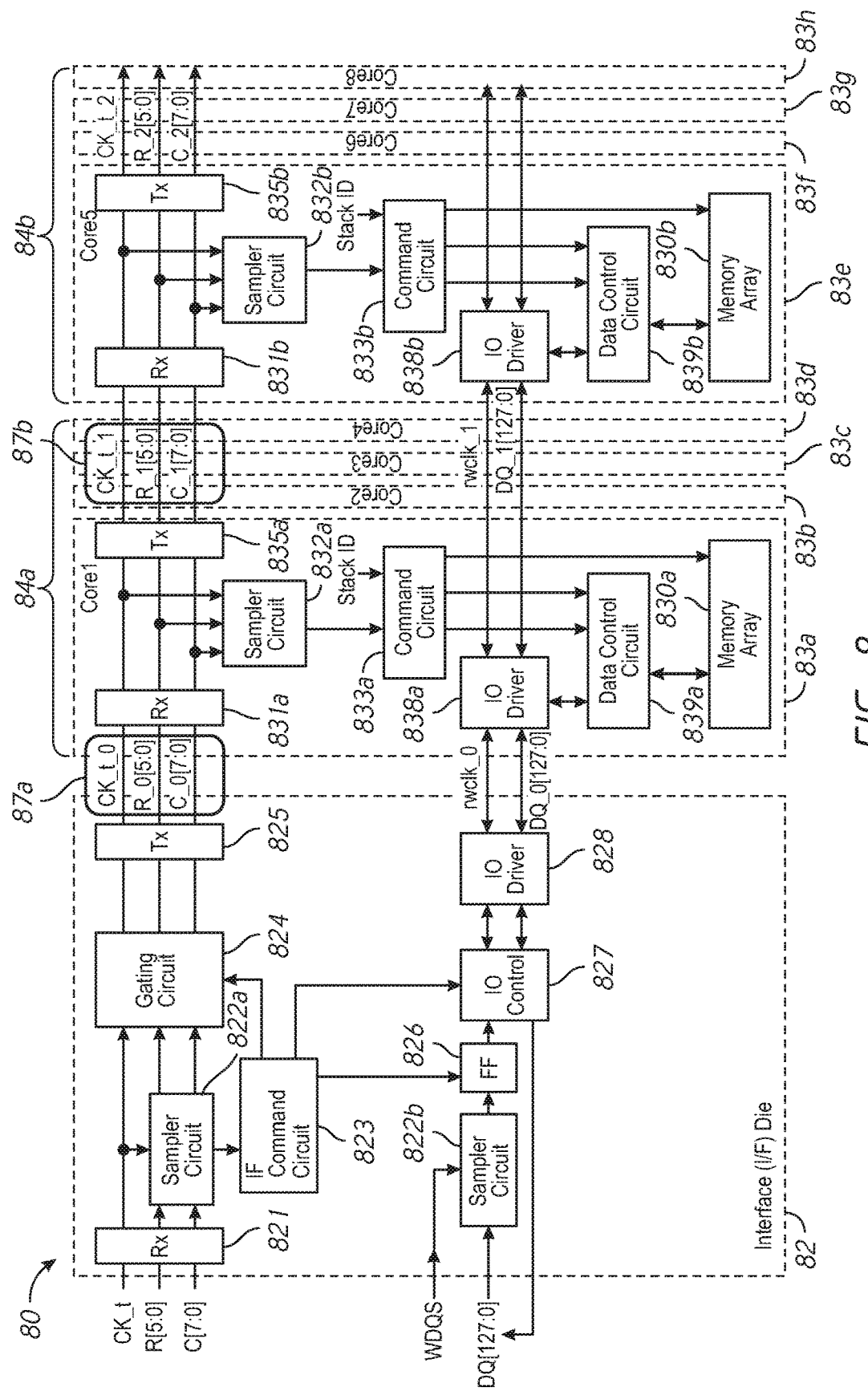
FIG. 8 is a block diagram of the HBM in a semiconductor device in accordance with an embodiment of the present disclosure.

FIG. 8 is a block diagram of an HBM in a semiconductor device in accordance with an embodiment of the present disclosure. For example, the HBM 80 may include an interface (I/F) die 82 and a plurality of core dies 83a to 83h. In FIG. 8, a stack group 84a includes four core dies Core1 83a to Core4 83d which have an SID "0." A stack group 84b includes four core dies Core5 83e to Core8 83h which have an SID "1." The I/F die 82 may include a plurality of input buffers Rx 821. The Rx 821 may receive a clock signal CK_t, a plurality of row command/address signals R[5:0] and a plurality of column command/address signals C[7:0]. The received signals R[5:0] and C[7:0] may be transmitted to a sampler circuit 822a. The sampler circuit 822a may capture the R[5:0] and C[7:0] signals by the CK_t signal and may further provide an intermediate IF command signal to an IF command circuit 823. The IF command circuit 823 may decode the intermediate IF command signal and may further provide one or more interface input/output (IFIO) control signals. The IFIO control signals may be provided to a gating circuit 824, a flip-flop (FF) circuit 826 and an IO control circuit 827. Responsive to the IFIO control signals, the gating circuit 824 may provide the clock signal from the 821a, the row command/address signals and the column command/address signals from the sampler circuit 822a to a plurality of output buffers Tx 825. The plurality of output buffers Tx 825a, 825b and 825c may provide a clock signal CK_t_0, a plurality of row command/address signals R_0 [5:0] and a plurality of column command/address signals C_0[7:0] which may have a delay relative to the CK_t, R[5:0] and C[7:0] signals. respectively via a conductive path 87a. For example, the delay corresponds to a delay caused by the IF command circuit 823. For example, the conductive path 87a may be through-silicon vias (TSVs) (e.g., a portion of the input/output line 37a).

The I/F die 82 may also receive a write data strobe signal WDQS and data signals DQ[127:0]. The received signals WDQS and DQ[127:0] may be transmitted to a sampler circuit 822b. The sampler circuit 822b may capture the DQ[127:0] signals on both rising and falling edges of the WDQS for a write operation. The IO control circuit 827 controls the write operation and a read operation based on the IFIO control signals from the IF command circuit 823. Responsive to IFIO control signals related to the read operation or the write operation, the IO control circuit 827 receives a read and write clock signal rwclk_0 via an IO driver 828. If the IF command is indicative of a command related to the write operation, the DQ[127:0] captured by the sampler circuit 822b may be transmitted to the IO control circuit 827 via the FF 826, and the IO control circuit 827 may further provide data signals DQ_0[127:0] which may have the delay relative to the DQ[127:0] via the IO driver 828 to the Corel die 83a together with the read and write clock signal rwclk_0, responsive to the IFIO control signals. If the IF command is indicative of a command related to the read operation, the IO control circuit 827 receives the read and write clock signal rwclk_0 via an IO driver 828 from the core die Corel 83a. Responsive to IFIO control signals related to the read operation, the DQ_0[127:0] responsive to the read and write clock signal rwclk_0 may be transmitted to the IO control circuit 827 via the IO driver 828 from the core die Corel 83a, and the IO control circuit 827 may further provide the data signals DQ[127:0] as a read out data, responsive to the IFIO control signals.

The core die Corel 83a may include a plurality of input buffers Rx 831a. The Rx 831a may receive the clock signal CK_t_0, a plurality of row command/address signals R_0 [5:0] and a plurality of column command/address signals C_0[7:0]. The received signals CK_t_0, R_0[5:0] and C_0 [7:0] may be provided to a plurality of output buffers Tx 835a, respectively, and the plurality of output buffers Tx 835a may provide CK_t_1, R_I_1[5:0] and C_0[7:0] to the core die Core5 83e by driving a conductive path 87b. For example, the conductive path 87b may be through-silicon vias (TSVs) (e.g., a portion of the input/output line 37a). The received signals CK_t 0, R_0[5:0] and C_0[7:0] may be provided to a sampler 832a. The sampler 832a may capture the R_0[5:0] and C_0[7:0] signals by the CK_t_0 signal and may further provide an intermediate core command signal to a command circuit 833a. The command circuit 833a may decode the intermediate core command signal and may obtain a core command. The command circuit 833a may be provided with a stack ID (SID) indicative of the stack group 84a (e.g., the SID "0"). The command circuit 833a compares the SID in the core command with the SID indicative of the stack group 84a. If the two SIDs matches, the command circuit 833a may execute a write operation or a read operation responsive to the core command. For example, the command circuit 833a may provide one or more core input/output (CIO) control signals responsive to the core command to a data control circuit 839a and at least one memory array 830a on the core die Core1 83a. Responsive to the CIO control signals, the data control circuit 839a may provide the read and write clock signal rwclk_0 from an IO driver 838a to the memory array 830a. The data control circuit 839a controls the write operation and the read operation based on the CIO control signals from the command circuit 833a. If the core command is indicative of a command related to the write operation, the data control circuit 839a may provide the DQ_0[127:0] received at the IO driver 838a from the I/F die 82 to the memory array 830a based on the read and write clock signal rwclk_0. If the core command is indicative of a command related to the read operation, the data control circuit 839a may read data from the memory array 830a and provide the read data as the DQ_0[127:0] via the IO driver 838a responsive to the read and write clock signal rwclk_0, and the IO driver 838a may further provide the data signals DQ_0[127:0] as a read out data together with the read and write clock signal rwclk_0 to the I/F die 82. In some embodiments, the IO driver 838a may further provide data signals DQ_1[127:0] and a read and write clock signal rwclk_1 based on the received data signals DQ_0[127:0] and the read and write clock signal rwclk_0, responsive to the SID in the core command being different from the SID of the stack group 84a in the write operation. In some embodiments, the IO driver 838a may further provide data signals DQ_1 [127:0] and a read and write clock signal rwclk_1 based on the received data signals DQ_0[127:0] and the read and write clock signal rwclk_0 in the write operation, regardless of the SID in the core command.

The core die Core5 83e may include a plurality of input buffers Rx 831b. The Rx 831b may receive the clock signal CK_t_1, a plurality of row command/address signals R_1 [5:0] and a plurality of column command/address signals C_1[7:0]. The received signals CK_t_1, R_1[5:0] and C_1 [7:0] may be provided to a sampler 832b. The sampler 832b may capture the R_1[5:0] and C_1[7:0] signals by the CK_t_1 signal and may further provide an intermediate core command signal to a command circuit 833b. The command circuit 833b may decode the intermediate core command signal and may obtain a core command. The command circuit 833b may be provided with a stack ID (SID) indicative of the stack group 84b (e.g., the SID "1"). The command circuit 833b compares the SID in the core command with the SID indicative of the stack group 84b. If the two SIDs matches, the command circuit 833b may execute a write operation or a read operation responsive to the core command. For example, the command circuit 833b may provide one or more core input/output (CIO) control signals responsive to the core command to a data control circuit 839b and at least one memory array 830b on the core die Core1 83e. Responsive to the CIO control signals, the data control circuit 839b may provide the read and write clock signal rwclk_1 from an IO driver 838b to the memory array 830b. The data control circuit 839b controls the write operation and the read operation based on the CIO control signals from the command circuit 833b. If the core command is indicative of a command related to the write operation, the data control circuit 839b may provide the DQ_1 [127:0] received at the IO driver 838b from the core die Core1 83a to the memory array 830b based on the read and write clock signal rwclk_1. If the core command is indicative of a command related to the read operation, the data control circuit 839b may read data from the memory array 830b and provide the read data responsive to the read and write clock signal rwclk_1, and the IO driver 838b may further provide the data signals DQ_1[127:0] as a read out data together with the read and write clock signal rwclk_1 to the core die Core1 83a.

Figure 9:
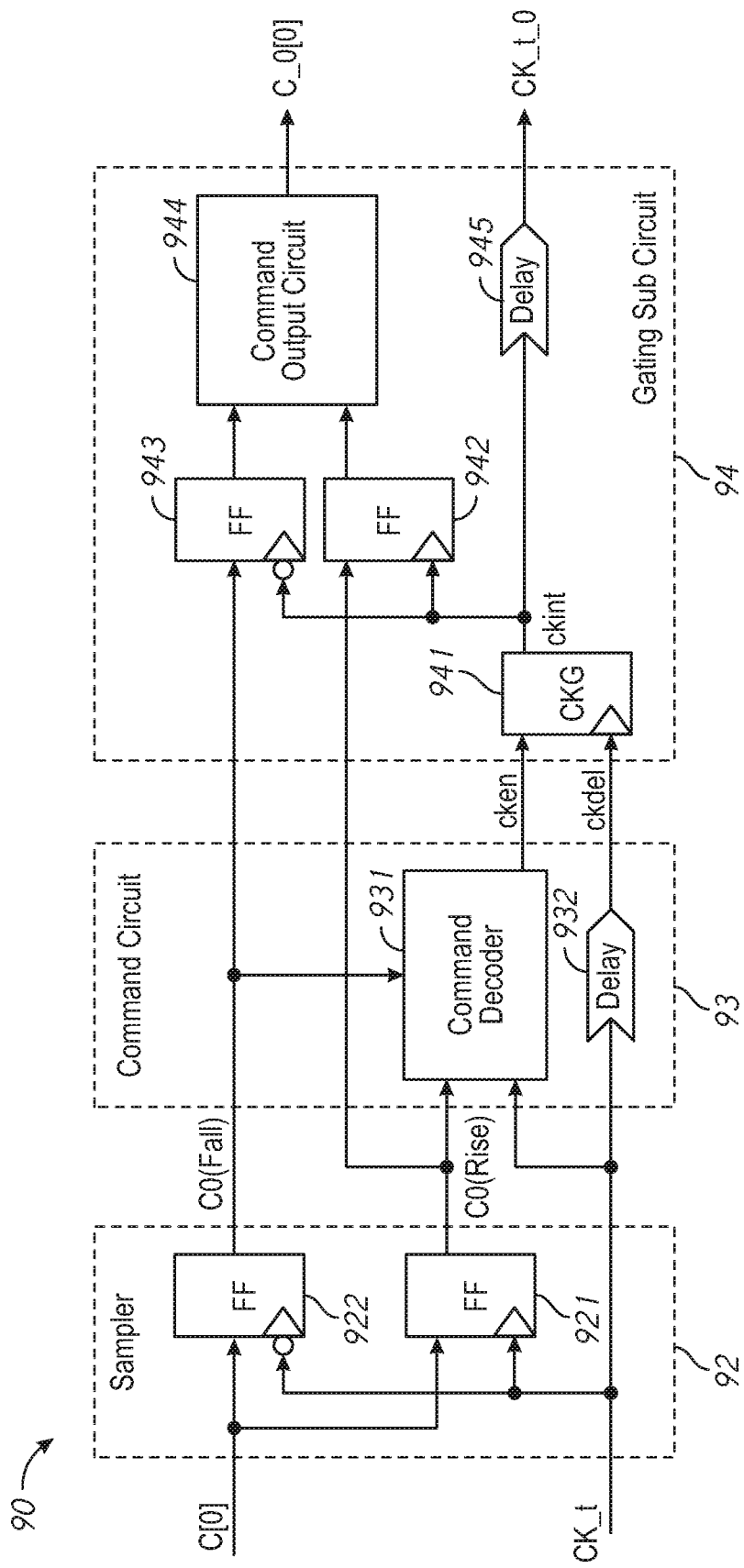
FIG. 9 is a block diagram of a command control circuit on an I/F die of an HBM in a semiconductor device in accordance with an embodiment of the present disclosure.

FIG. 9 is a block diagram of a command control circuit on an I/F die 90 of an HBM in a semiconductor device in accordance with an embodiment of the present disclosure. For example, the command control circuit 90 may be implemented on the I/F die 82 shown in FIG. 8 in some embodiments. The command control circuit 90 may receive a column command/address signal C[0] and a clock signal CK_t. For example, the C[0] signal may be used to implement the C[0] signal of the plurality of column command/address signals C[7:0] in FIG. 8 and the CK_t may be used to implement the CK_t signal in the FIG. 8. The C[0] signal may include an SID bit at a first falling edge as shown in FIG. 6. The command control circuit 90 may include a sampler 92, a command circuit 93 and a gating sub circuit 94. The sampler 92, the command circuit 93 and the gating sub circuit 94 may be included in the sampler circuit 822a, the IF command circuit 823 and the gating circuit 824 in FIG. 8, respectively. The sampler 92 may include flip-flop circuits (FF) 921 and 922. The FF 921 receives the C[0] signal at a data input and the CK_t signal at a clock input. The FF 921 captures the C[0] signal in response to a rising edge of the CK_t signal and provides the C0(Rise) signal according to the C[0] signal until a next rising edge of the CK_t signal. The FF 922 receives the C[0] signal at a data input and an inversed signal of the CK_t signal at a clock input. The FF 922 captures the C[0] signal in response to a falling edge of the CK_t signal and provides the C0(Fall) signal according to the C[0] signal until a next falling edge of the CK_t signal.

The command circuit 93 may include a command decoder 931 and a delay circuit 932. The command decoder 931 may receive the C0(Rise) signal, the C0(Fall) signal and the CK_t signal and may further decode the C0(Rise) and C0(Fall) (and other column command/address signals, which is not shown in FIG. 9) responsive to the CK_t signal and obtains a column command. The command decoder provides a clock enable signal cken responsive to the column command. For example, an active cken signal (e.g., having a logic high level) may be provided when the column command is related to functions other than CNOP. When the column command is indicative of the function CNOP, the cken signal may not be active (e.g., having a logic low level). The delay circuit 932 delays an input signal by a decoding delay by the command decoder 931 for decoding. Thus, the delay circuit 932 provides a delayed clock signal ckdel having the decoding delay relative to the CK_t signal.

The gating sub circuit 94 may include a clock gate circuit CKG 941, flip-flop circuits (FF) 942 and 943, a composition circuit 944 and a delay circuit 945. The clock gate circuit CKG 941 receives the cken signal at a data input and the ckdel signal at a clock input. The CKG 941 provides the cken signal as an intermediate result signal (not shown) while the ckdel signal is not active (e.g., a logic low level) and a level of the intermediate result signal is maintained while the ckdel signal is being active (e.g., a logic high level). The CKG 941 provides an intermediate clock signal ckint which is a result of an AND operation of the intermediate result signal and the ckdel signal. The FF 942 receives the C0(Rise) signal at a data input and the ckint signal at a clock input. The FF 942 captures the C0(Rise) signal in response to a rising edge of the ckint signal and provides the C_0[0](Rise) signal according to the C[0] (Rise) signal to the composition circuit 944 until a next rising edge of the ckint signal. The FF 943 receives the C0(Fall) signal at a data input and an inversed signal of the ckint signal at a clock input. The FF 943 captures the C0(Fall) signal in response to a falling edge of the ckint signal and provides the C_0[0](Fall) signal according to the C0(Fall) signal to the composition circuit 944 until a next falling edge of the ckint signal. The composition circuit 944 receives the C_0[0] (Rise) signal and the C_0[0](Fall) signal and provides a composite signal C_0[0]. The delay circuit 945 delays an input signal by a composition delay by the composition circuit 944. Thus, the delay circuit 945 provides a core clock signal CK_t_0 having the composition delay relative to the ckint signal. Thus, the clock gate circuit CKG 941 may provide the core clock signal CK_t_0 to core dies when the column command is related to functions other than CNOP, whereas the clock gate circuit CKG 941 may terminate providing the core clock signal CK_t_0 to core dies when the column command is indicative of the CNOP function.

The command control circuit 90 may also include combinations of a sampler and a gating sub circuit for each of C[7:1] signals (not shown). The combination of the sampler and the gating sub circuit may be similar to the sampler 92 and the gating sub circuit 94, however, the gating sub circuits for the C[7:1] signals may not include a clock gate circuit that is equivalent to the CKG 941, instead, obtain the ckint signal from the clock gate circuit CKG 941.

Figure 7:
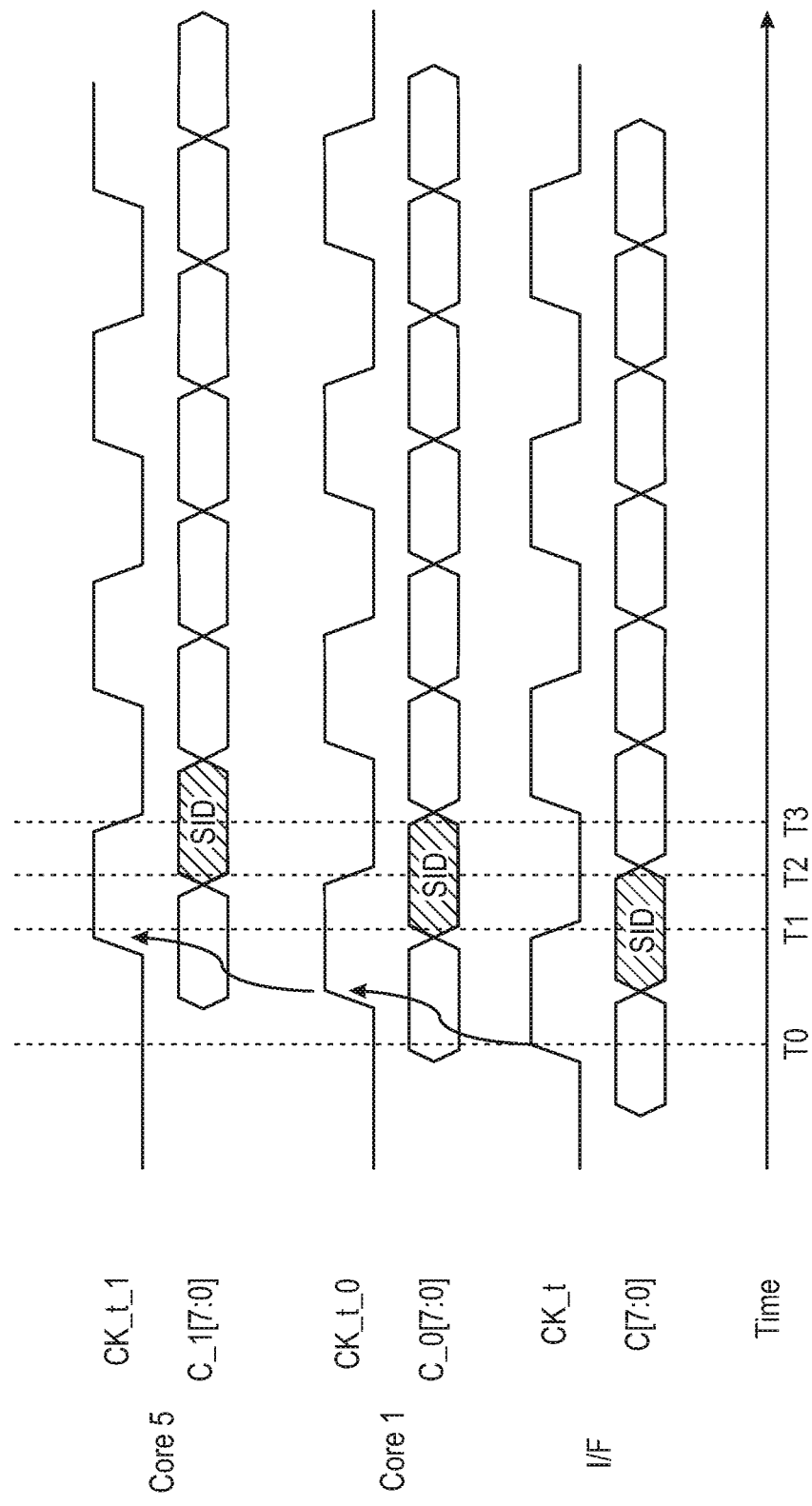
FIG. 7 is a timing diagram of clock signals and command signals to be provided to a portion of dies in the HBM stack.
Figure 10:
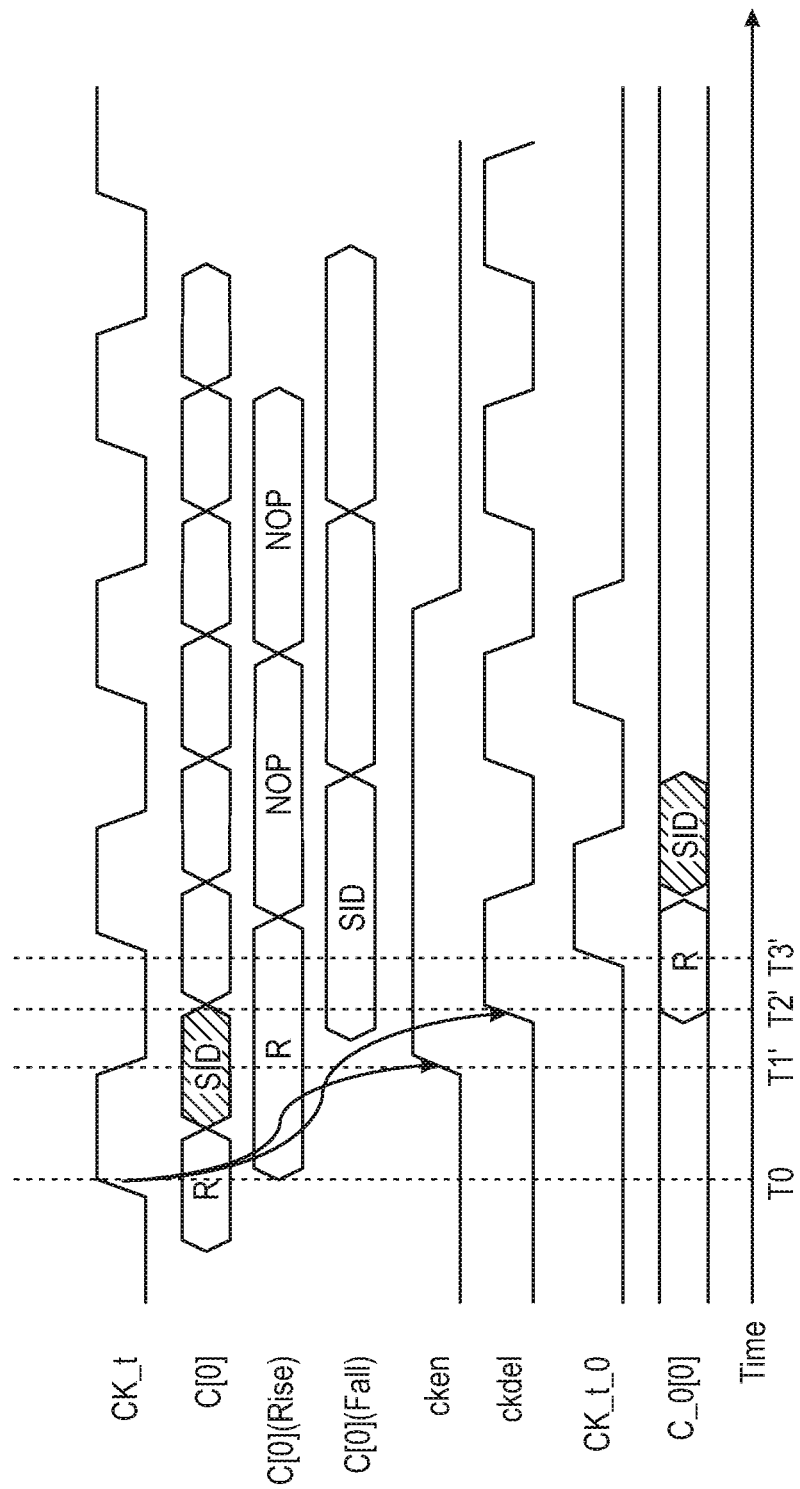
FIG. 10 is a timing diagram of clock related signals and column command signals in the command control circuit in FIG. 9, in accordance with an embodiment of the present disclosure.

FIG. 10 is a timing diagram of clock related signals and column command signals in the command control circuit 90 in FIG. 9, in accordance with an embodiment of the present disclosure. As mentioned earlier, the C[0] signal may include an SID bit at the first falling edge as shown in FIG. 6. The sampler 92 may capture the C[0] signal "R" at a rising edge of a first clock cycle of the clock signal CK_t at time T0 and may provide the C0(Rise) signal indicative of the "R" from the FF 921 from the time T0, until a next bit is captured. The sampler 92 may capture the SID included in the C[0] signal at a falling edge of the first clock cycle of the CK_t signal at time T1' and may provide the C0(Fall) signal indicative of the SID from the FF 922 from the time T1', until a next bit is captured. For example, the cken signal may be activated at around T1', due to the decoding delay. According to the decoding delay, the ckdel signal may be provided with the decoding delay relative to the CK_t signal from time T2'. In the gating circuit 94, the C0(Rise) signal and C0(Fall) signal are composited and provided as the C_0[0] signal. According to the composition delay, CK_t_0 signal may be provided with the composition delay relative to the ckdel signal from time T3'. In this example, the CK_t_0 signal has a delay "T3'-T0" (e.g., about one clock cycle) from the CK_t signal, which is significantly longer than the propagation delay from the I/F die 32 to the Core 1 die 33a represented by "T2-T1" in FIG. 7 (e.g., about a quarter clock cycle).

Figure 11:
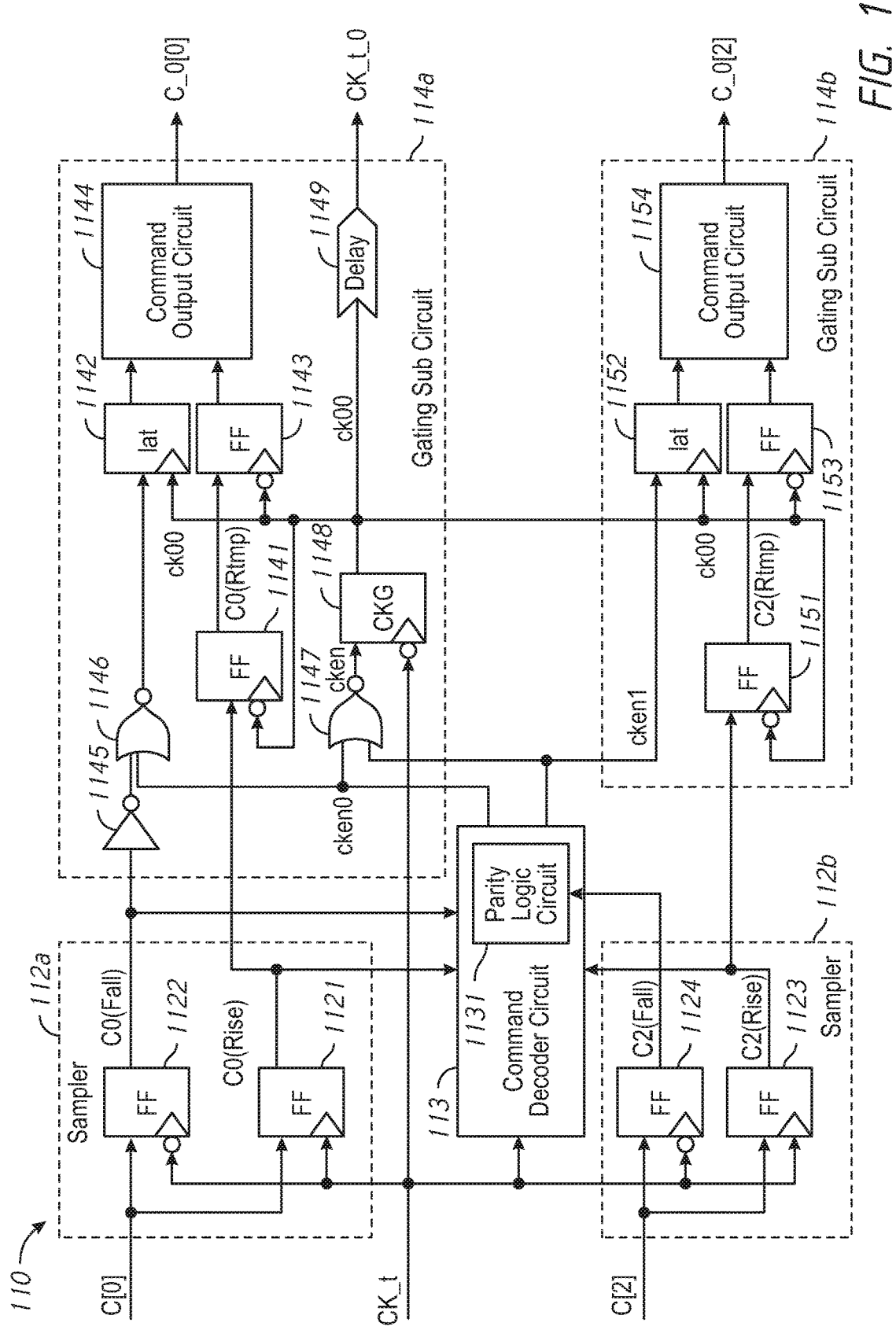
FIG. 11 is a block diagram of a portion of a command control circuit on an I/F die of an HBM in a semiconductor device in accordance with an embodiment of the present disclosure.

FIG. 11 is a block diagram of a portion of a command control circuit 110 on an I/F die of an HBM in a semiconductor device in accordance with an embodiment of the present disclosure. For example, the command control circuit 110 may be implemented on the I/F die 82 shown in FIG. 8 in some embodiments. The command control circuit 110 may receive column command/address signals C[7:0] and a clock signal CK_t. The command control circuit 110 may decode the column command/address signals C[7:0] and may further provide column command/address signals C_0[7:0] related to the column command/address signals C[7:0] and the CK_t_0 related to the clock signal CK_t. Here, the command control circuit 110 may provide the column command/address signals C_0[7:0] including the SID in the command in a different clock cycle earlier than an originally transmitted clock cycle (e.g., C[0] at a rising edge that is earlier than at C[0] at a falling edge, in FIG. 6). The command control circuit 110 may provide at least a portion of the column command/address signals including command information in an order different from an order that the at least a portion of the column command/address signals are received. For example, the command control circuit 110 on the I/F die 82 may receive first command information and may further receive second command information including the SID after receiving the first command information. The command control circuit 110 on the I/F die may provide the second command information and may further provide the first command information after providing the second command information.

Figure 12A:
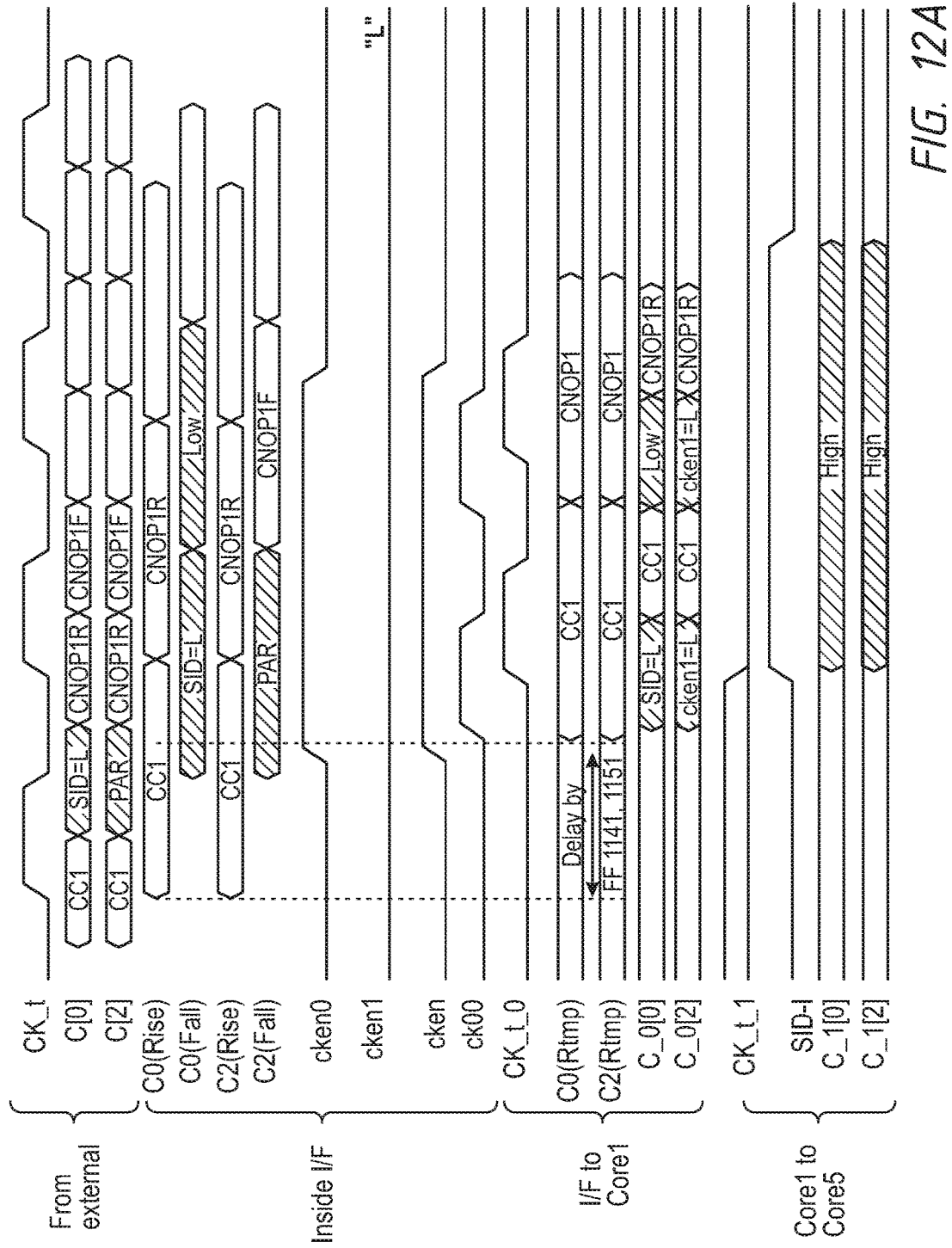
FIGS. 12A and 12B are timing diagrams of clock related signals and column command signals in the HBM in FIG. 8, in accordance with an embodiment of the present disclosure.
Figure 12B:
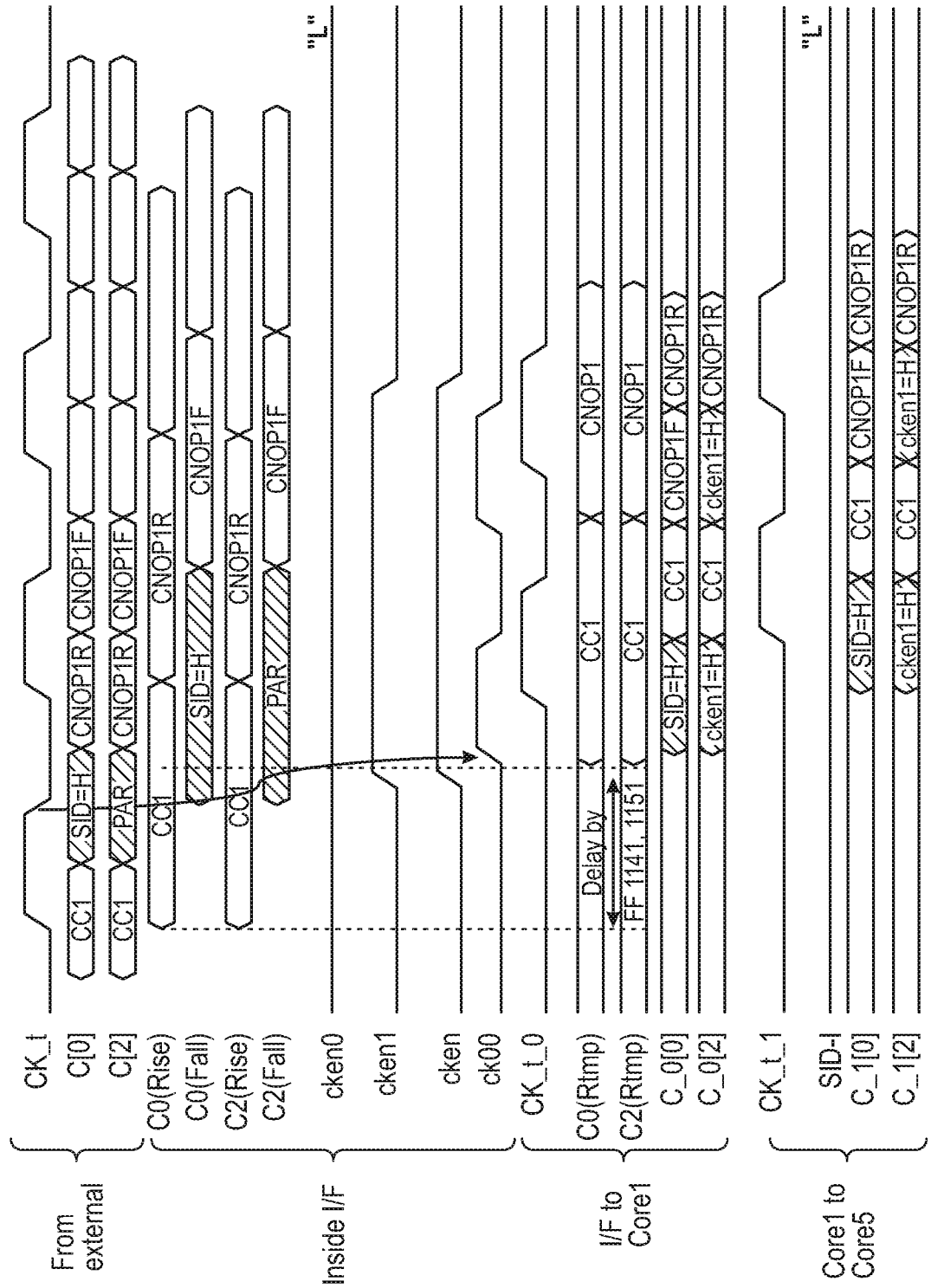

For example, FIG. 11 shows circuitry for processing C[0] and C[2] signals which may be used to implement the C[0] and C[2] signals of the plurality of column command/address signals C[7:0] in FIG. 8 and the CK_t may be used to implement the CK_t signal in the FIG. 8. The command control circuit 110 may include samplers 112a and 112b, a command decoder circuit 113 and gating circuits 114a and 114b. The samplers 112a and 112b may be included in the sampler circuit 822a. The command decoder circuit 113 may be the IF command circuit 823. The gating sub circuits 114a and 114b may be included in the gating circuit 824 in FIG. 8. FIGS. 12A and 12B are timing diagrams of clock related signals and column command signals in the command control circuit in FIG. 11, in accordance with an embodiment of the present disclosure. FIG. 12A provides the timing diagrams when the SID is "L" (or "0") and a latency counter (which will be described in detail later in this disclosure) is in the I/F die 82. FIG. 12B provides the timing diagrams when the SID is "H" (or "1") and the latency counter is in the I/F die 82.

The C[0] signal may include an SID bit at a first falling edge as shown in FIG. 6. The sampler 112a may include flip-flop circuits (FF) 1121 and 1122. The FF 1121 receives the C[0] signal at a data input and the CK_t signal at a clock input. The FF 1121 captures the C[0] signal in response to a rising edge of the CK_t signal and provides the C0(Rise) signal according to the C[0] signal until a next rising edge of the CK_t signal. The FF 1122 receives the C[0] signal at a data input and an inversed signal of the CK_t signal at a clock input. The FF 1122 captures the C[0] signal in response to a falling edge of the CK_t signal and provides the C0(Fall) signal according to the C[0] signal until a next falling edge of the CK_t signal. For example, FIG. 12 A shows that the C[0] signal includes column command (CC1) information at a rising edge of a first clock cycle.

The C[2] signal may include a parity bit PAR at a first falling edge as shown in FIG. 6. The sampler 112b may include flip-flop circuits (FF) 1123 and 1124. The FF 1123 receives the C[2] signal at a data input and the CK_t signal at a clock input. The FF 1123 captures the C[2] signal in response to a rising edge of the CK_t signal and provides the C2(Rise) signal according to the C[2] signal until a next rising edge of the CK_t signal. The FF 1124 receives the C[2] signal at a data input and an inversed signal of the CK_t signal at a clock input. The FF 1124 captures the C[2] signal in response to a falling edge of the CK_t signal and provides the C2(Fall) signal according to the C[2] signal until a next falling edge of the CK_t signal.

The command decoder circuit 113 may receive the C0(Rise), C0(Fall), C2(Rise) and C2(Fall) signals and the CK_t signal and may further decode the C0(Rise), C0(Fall), C2(Rise) and C2(Fall) signals (and other column command/address signals, which is not shown in FIG. 11) responsive to the CK_t signal to obtain a column command. For example, the command decoder circuit 113 may detect whether an access request represented by the column command is addressed to a stack group with SID "0" (e.g., the stack group 84a) or a stack group with SID "1" (e.g., the stack group 84b), responsive to the SID provided on the C0(Fall) signal. The command decoder circuit 113 may activate a clock enable signal cken0 (e.g., set to a logic high level) and may keep a clock enable signal cken1 deactivated (e.g., set to a logic low level) for a longer period than a transmission period of the command (e.g., two clock cycles), responsive to the SID "0" as shown in FIG. 12A. The command decoder circuit 113 may activate the cken1 signal and may keep the cken0 signal deactivated for the longer period than the transmission period of the command, responsive to the SID "1" as shown in FIG. 12B. If the column command is indicative of the function CNOP and the C0(Rise), C0(Fall), C2(Rise) and C2(Fall) signals include CNOP information, such as CNOP1R and CNOP1F information, responsive to the C[0] and C[2] signals including CNOP1R and CNOP1F information in rising and falling edges respectively, then any of the cken0 signal and the cken1 signal which is active may be deactivated as shown in FIGS. 12A and 12B. The command decoder circuit 113 may include a parity logic circuit 1131. The parity logic circuit 1131 receives the parity bit PAR included in the C[2](Fall) signal, and executes a parity check with regards to the column/address signals. As the parity check may be executed on the command decoder circuit 113 (e.g., the IF command circuit 823 on the I/F die 82 of the HBM 80), and not used in the core dies (e.g., the core dies 83a to 83h), the parity bit PAR may not be provided to the core dies.

The gating sub circuit 114a may include flip-flop circuits (FF) 1141 and 1143, a latch circuit 1142, a command output circuit 1144, a clock gate circuit CKG 1148 and a delay circuit 1149. The clock gate circuit CKG 1148 receives a clock enable signal cken at a data input and an inverted signal of the CK_t signal at a clock input. The cken signal is an output signal of an OR circuit 1147 which becomes active responsive to one of the cken0 signal and the cken1 signal being active. Similarly to the CKG 941, the CKG 1148 provides an inverted signal of the CK_t signal as a ck00 signal while the cken signal is being active (e.g., a logic high level) and the level of the ck00 signal is maintained inactive (e.g., a logic low level) while the cken signal is being inactive. The delay circuit 1149 delays the ck00 signal by a processing delay by the command output circuit 1144.

The C0(Fall) signal may be provided to an inverter 1145 and the inverted C0(Fall) signal may be provided to a NOR circuit 1146. The NOR circuit 1146 provides an output signal responsive to the inverted C0(Fall) signal and the cken0 signal. A latch circuit 1142 receives the output signal of the NOR circuit 1147 at a data input and the ck00 signal at a clock input. The latch circuit 1142 provides the output signal of the NOR circuit 1147 as an output signal to the command output circuit 1144 responsive to the ck00 signal being active (e.g. at a logic low level) and further maintains a logic level of the output signal to the command output circuit 1144 while the ck00 signal is being inactive (e.g., at a logic high level). The C0(Rise) signal may be provided to a data input of the FF 1141 and the ck00 signal may be provided to a clock input of the FF 1141. The FF 1141 captures the C0(Rise) signal in response to a rising edge of the ck00 signal and provides a C0(Rtmp) signal according to the C0(Rise) signal to the FF 1143 until a next rising edge of the ck00 signal. Thus, the FF 1141 may provide a delay of more than a half clock cycle to the C0(Rtmp) signal relative to C0(Rise) signal. The FF 1143 receives the C0(Rtmp) signal at a data input and an inversed signal of the ck00 signal at a clock input. The FF 1143 captures the C0(Rtmp) signal in response to a falling edge of the ck00 signal and provides an output signal to the command output circuit 1144 until a next falling edge of the ck00 signal. The command output circuit 1144 receives the output signal of the latch circuit 1142 and the output signal of the FF 1143, and provides a C_0[0] signal. Here, the command output circuit 1144 provides the C_0[0] signal including command information of the output signal of the latch circuit 1142 originated from the C0(Fall) signal and command information of the output signal of the FF 1143 originated from the C0(Rise) signal in this order, due to the delay of the FF 1141 on C0(Rtmp). Thus, the command information on the C0(Fall) signal is provided and the command information on the C0(Rise) signal is provided after the command information on the C0(Fall) is provided. In this manner, the gating sub circuit may change (e.g., swap) a transmission order of a plurality of pieces of command information across two clock cycles (e.g., at a rising edge and at a falling edge) in the C_0[0] signal relative to the C[0] signal shown in FIGS. 12A and 12B to transmit the SID at an earliest possible timing (e.g., at the first clock cycle of the two clock cycles).

The gating sub circuit 114b may include flip-flop circuits (FF) 1151 and 1153, a latch circuit 1152 and a command output circuit 1154. A latch circuit 1152 receives the cken1 signal at a data input and the ck00 signal at a clock input. The latch circuit 1152 provides the cken1 signal as an output signal to the command output circuit 1154 responsive to the active ck00 signal (e.g. at the logic low level) and further maintains a logic level of the output signal to the command output circuit 1144 while the ck00 signal is being inactive (e.g., at the logic high level). The C2(Rise) signal may be provided to a data input of the FF 1151 and the ck00 signal may be provided to a clock input of the FF 1151. The FF 1151 captures the C2(Rise) signal in response to a rising edge of the ck00 signal and provides a C2(Rtmp) signal according to the C2(Rise) signal to the FF 1153 until a next rising edge of the ck00 signal. Thus, the FF 1151 may provide a delay of more than a half clock cycle to the C2(Rtmp) signal relative to C2(Rise) signal. The FF 1153 receives the C2(Rtmp) signal at a data input and an inversed signal of the ck00 signal at a clock input. The FF 1153 captures the C2(Rtmp) signal in response to a falling edge of the ck00 signal and provides an output signal to the command output circuit 1154 until a next falling edge of the ck00 signal. The command output circuit 1154 receives the output signal of the latch circuit 1152 and the output signal of the FF 1153, and provides a C_0[2] signal. Here, the command output circuit 1154 provides the C_0[2] signal including command information of the output signal of the latch circuit 1152 originated from the C2(Fall) signal and command information of the output signal of the FF 1153 originated from the C2(Rise) signal in this order, due to the delay of the FF 1151 on C2(Rtmp). Thus, the command information on the C2(Fall) signal is provided and the command information on the C2(Rise) signal is provided after the command information on the C2(Fall) is provided. In this manner, the gating sub circuit 114b may change (e.g., swap) a transmission order of a plurality of pieces of command information across two clock cycles (e.g., at a rising edge and at a falling edge) in the C_0[2] signal relative to the C[2] signal shown in FIGS. 12A and 12B to transmit the cken1 information at an earliest possible timing (e.g., at the first clock cycle of the two clock cycles). Because the PAR bit may not be used in the core dies, command information on the cken1 signal corresponding to the SID may be reflected on C_0[2] at a rising edge in place of the PAR bit.

The command control circuit 110 may also include combinations of a sampler and a gate circuit for each of C[7:3, 1] signals (not shown). The combination of the sampler and the gate circuit may be similar to the sampler 112b and the gating circuit 114b, however, the gating circuits for the C[7:3, 1] signals may not include an FF equivalent to the FF 1151. Unlike the C[2] and C[0] signals, the C[7:3, 1] signals were provided without swapping an order of the information.

Figure 13:
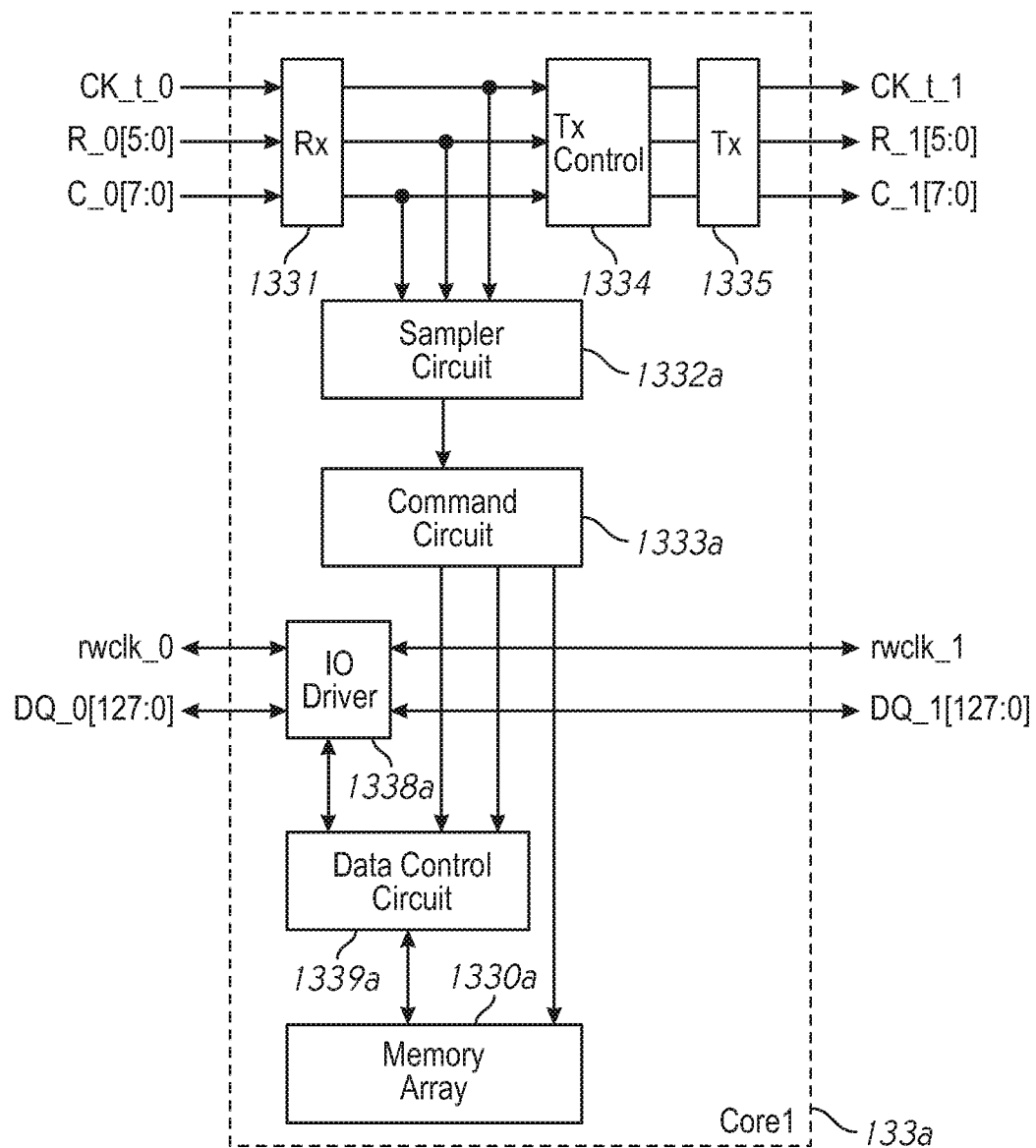
FIG. 13 is a block diagram of a portion of a core die in the HBM in a semiconductor device in accordance with an embodiment of the present disclosure.

FIG. 13 is a block diagram of a portion of a core die in the HBM in a semiconductor device in accordance with an embodiment of the present disclosure. Description of components and signals corresponding to components and signals included in FIG. 8 will not be repeated. For example, a core die Corel 133a which has an SID "0" may be used as a Corel 83a in FIG. 8. The core die Corel 133a may include a plurality of input buffers Rx 1331 which may receive the clock signal CK_t_0, a plurality of row command/address signals R_0[5:0] and a plurality of column command/address signals C_0[7:0], respectively. The received signals CK_t_0, R_0[5:0] and C_0[7:0] may be provided from the plurality of input buffers Rx 1331 to an output buffer (Tx) control circuit 1334. The Tx control circuit 1334 detects the SID included in the C_0[0] at a rising edge of the CK_t_0 signal as shown in FIGS. 12A and 12B, and provides clock signal CK_t_1, a plurality of row command/address signals R_1[5:0] and a plurality of column command/address signals C_1[7:0] through a plurality of output buffers Tx 1335 which drive the conductive path 87b (FIG. 8), responsive to the SID information being different from the SID "0" (e.g., the SID "1"). If the SID information is indicative the SID "0" for the core die Corel 133a, the Tx control circuit 1334 may stop providing the CK_t_1, R_1[5:0] and C_1[7:0] signals by refraining from driving the conductive path 87b.

Figure 14:
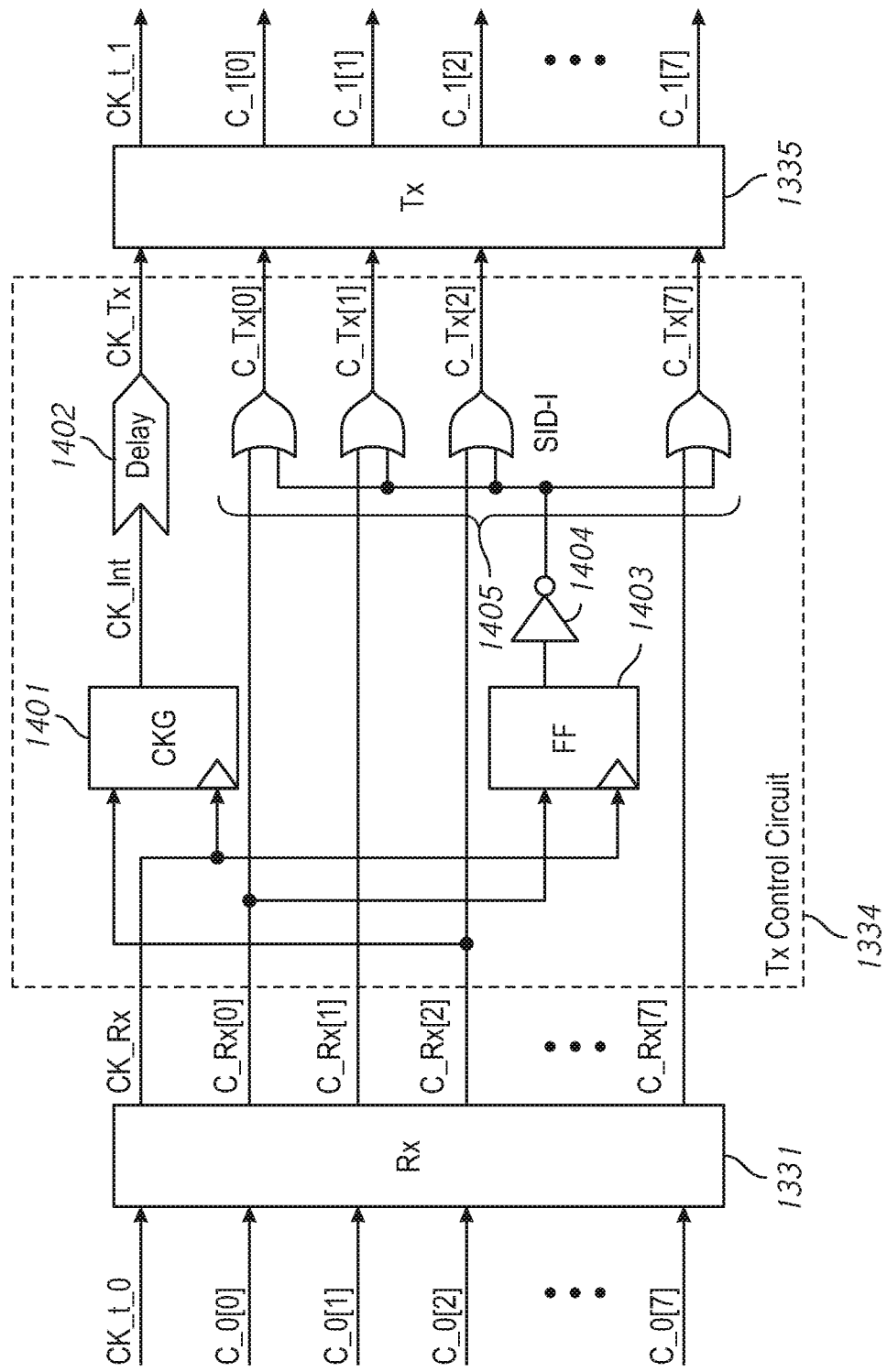
FIG. 14 is a block diagram of an output buffer control circuit on the core die in FIG. 13 in accordance with an embodiment of the present disclosure.

FIG. 14 is a block diagram of the Tx control circuit 1334 on the core die 133a in FIG. 13 in accordance with an embodiment of the present disclosure. The core die Corel 133a may include a plurality of input buffers Rx 1331 which may receive the clock signal CK_t_0 and a plurality of column command/address signals C_0[7:0], respectively. For example, the plurality of input buffers Rx 1331 may provide the received signals CK_t_0 and C_0[7:0] as CK_Rx and C_Rx[7:0] signals to the Tx control circuit 1334, respectively.

Figure 1:
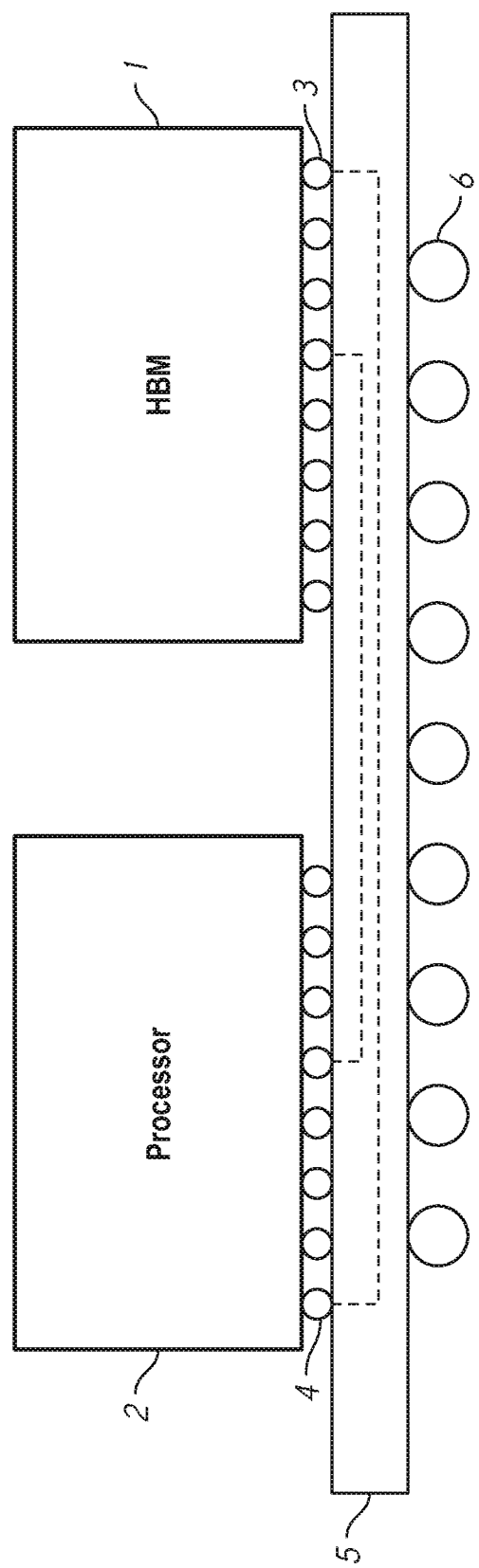
FIG. 1 is a wiring diagram of a High Bandwidth Memory (HBM) and a processor.
Figure 4A:
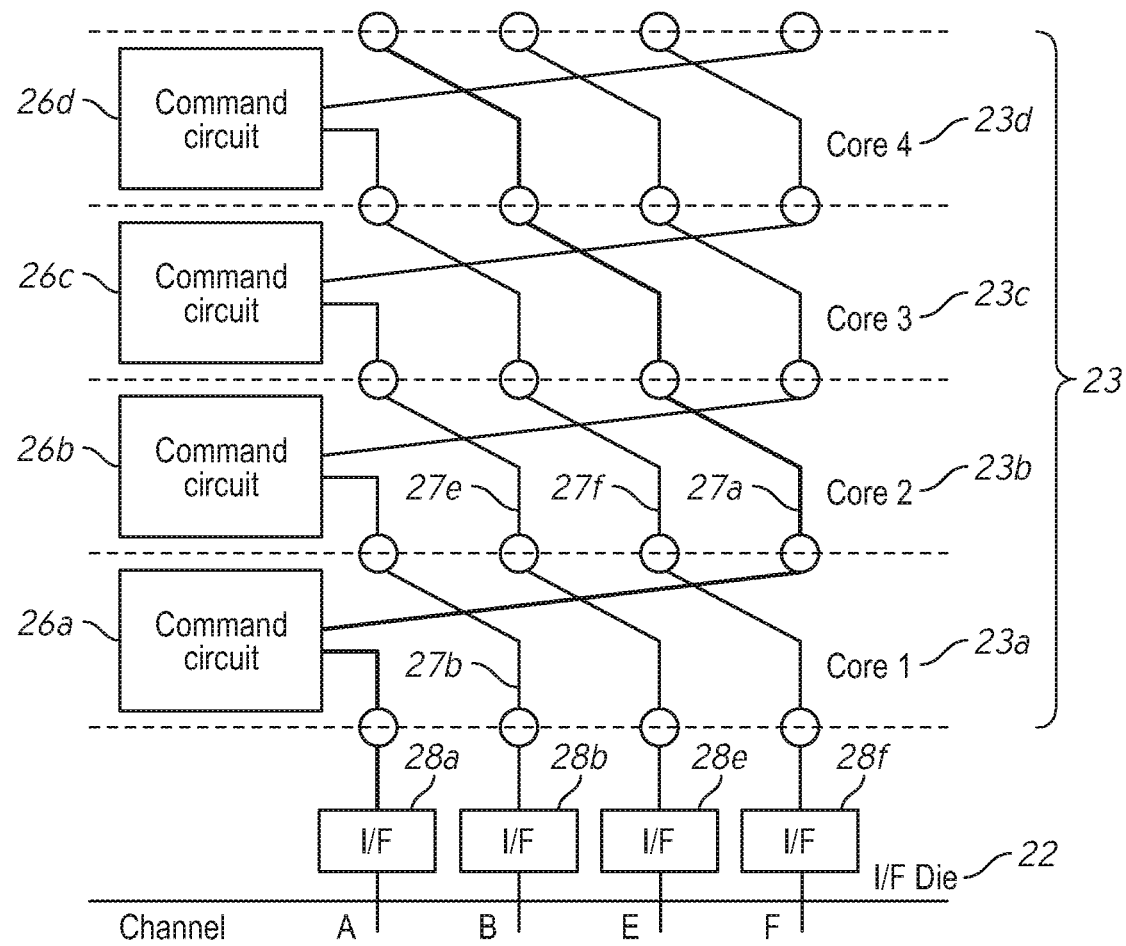
FIG. 4A is a wiring diagram of the HBM stack including an I/F die and a plurality of core dies.
Figure 4B:
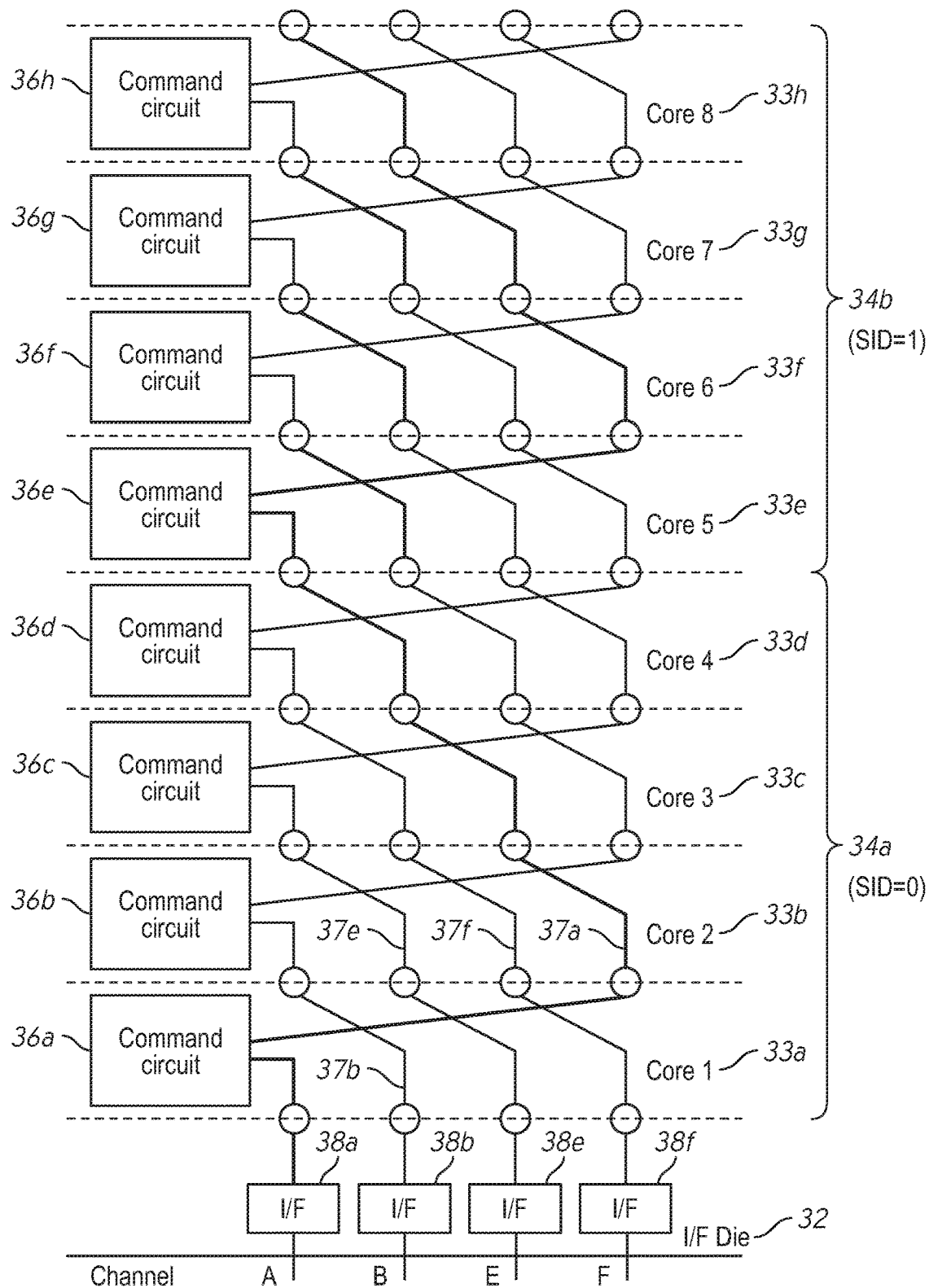
FIG. 4B is a wiring diagram of the HBM stack including an I/F die and a plurality of core dies.

For example, the Tx control circuit 1334 may include a FF 1403. As mentioned earlier, the C_0[0] may include the SID at a rising edge of the first clock cycle as shown in FIGS. 12A and 12B. Thus, the C_Rx[0] signal may include the SID information at a rising edge of a first clock cycle of the CK_Rx. The FF 1403 may receive the C_Rx[0] signal at a data input and the CK_Rx signal at a clock input. The FF 1403 captures the C_Rx[0] signal in response to a rising edge of the CK_Rx signal and an inverter 1404 receives an output signal from the FF 1403 and provides an SID_I signal which is an inverted signal of the SID. A plurality of OR circuits 1405 may receive C_Rx[7:0] and provide the C_Tx [7:0] responsive to the SID_I signal. Thus, the C_Tx[7:0] may be C_Rx[7:0] when the SID_I signal is at a logic low level indicating that the column command is provided to an upper core die. The plurality of output buffers Tx 1335 may receive the C_Tx[7:0] and may further drive the conductive path 87b (e.g., 37a in FIG. 4B) in order to provide C_I [7:0] to upper core dies. The C_Tx[7:0] may be set to a logic high level in order to refrain from driving the conductive path 87b, when the SID_I signal is at a logic high level indicating that the column command is provided to the core die Corel 133a.

For example, the Tx control circuit 1334 may include a clock gate circuit CKG 1401. The clock gate circuit CKG 1401 may receive the CK_Rx signal at a clock input and the C_Rx[2] signal at a data input. As mentioned earlier, the C_0[2] may include the cken1 signal at a rising edge of the first clock cycle as shown in FIGS. 12A and 12B. Thus, the C_Rx[2] signal may include the cken1 information indicative of whether a stack group designated is at a current die (e.g., at a logic low level) or at an upper core die (e.g., at a logic high level), at the rising edge of the first clock cycle. The CKG 1401 provides C_Rx[2] signal as an intermediate result signal (not shown) while the CK_Rx signal is not active (e.g., a logic low level) and a level of the intermediate result signal is maintained while the CK_Rx signal is being active (e.g., a logic high level). The CKG 1401 provides an intermediate clock signal CK_Int which is a result of an AND operation of the intermediate result signal and the CK_Rx signal. Thus, the CKG 1401 is opened to allow the CK_Int signal to be conveyed to the upper die when the stack group indicated belongs to the upper die. For example, the CKG 1401 is opened responsive to the C_Rx[2] signal having the logic high level. On the other hand, the CKG 1401 is closed to block the CK_Int signal from being conveyed to the upper die when the stack group is associated with the current die. For example, the CKG 1401 is closed responsive to the C_Rx[2] signal having the logic low level. A delay circuit 1402 receives the CK_Int signal and delays the CK_Int signal in order to provide an output clock signal CK_Tx. The output clock signal CK_Tx has a delay relative to the CK_Rx signal where the delay corresponds to a delay of the C_Tx[7:0] signals relative to the C_Rx[7:0] signals. The delay circuit 1402 provides a clock signal CK_Tx having the delay relative to the CK_Rx signal. One buffer of the plurality of output buffers Tx 1335 may receive the CK_Tx and provide CK_t_1 to upper core dies.

Thus, the Tx control circuit 1334 may be opened to allow the clock signal CK_t_1 and the C_1[7:0] signals to be conveyed to the upper core dies, when the column command is related to a stack group of the upper core dies, whereas the Tx control circuit 1401 may be closed to block the clock signal CK_t_1 and the C_[7:0] signals from being conveyed to upper core dies by setting these signals to predetermined levels (e.g., the logic low level for CK_t_1 signal, and the logic high level for the C_1[7:0] signals) when the column command is related to a stack group of lower core dies (e.g., the core die Corel 133a).

Figure 15:
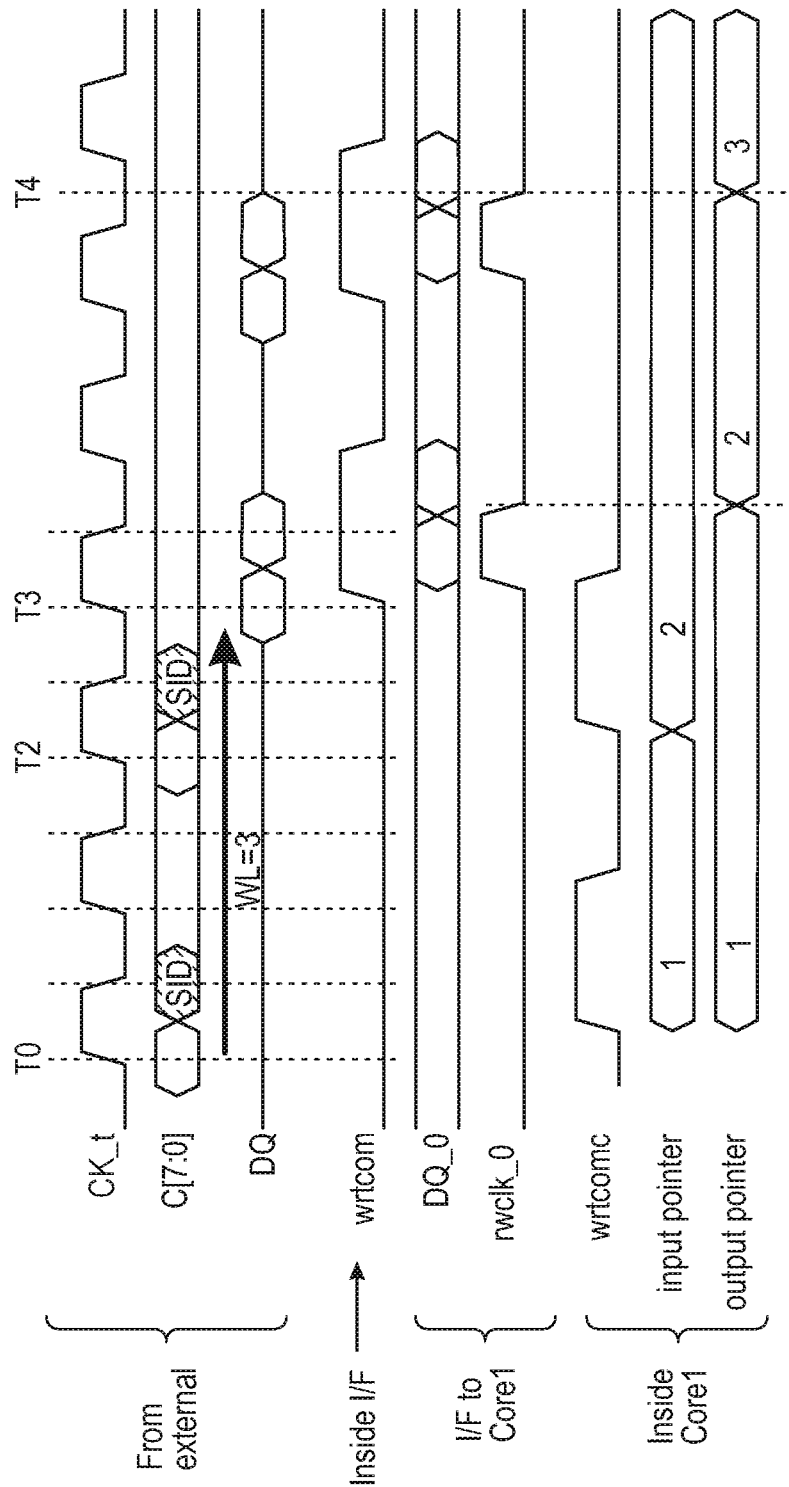
FIG. 15 is a timing diagram of clock signals, command signals and data signals to be provided to a portion of dies in a write operation, in accordance with an embodiment of the present disclosure.
Figure 16:
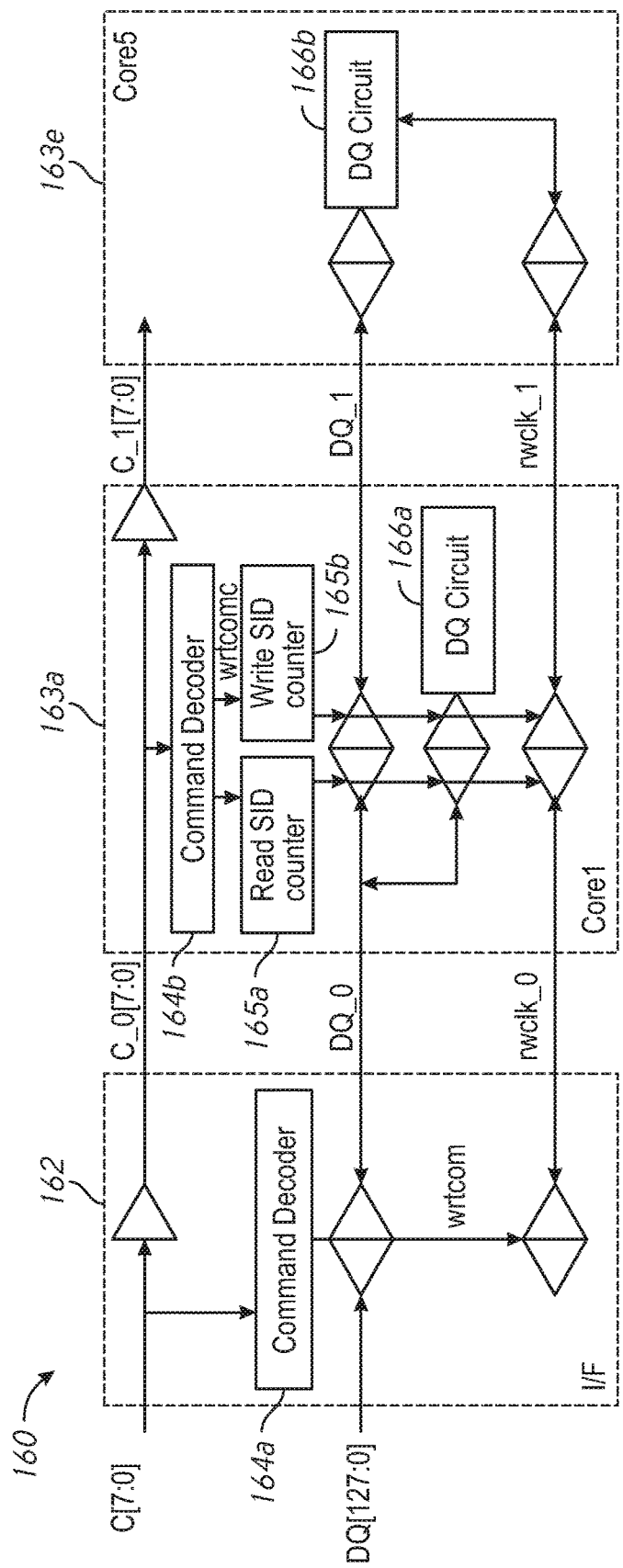
FIG. 16 is a block diagram of the HBM in a semiconductor device in accordance with an embodiment of the present disclosure.

The HBM 1 may support a "data read/write latency" function to adjust a delay of data to be read/written relative to a read/write command. For example, data write latency may be defined from a rising edge of a clock signal on which the write command is issued to a rising edge of the clock signal from which a first byte of the data to be written is provided. FIG. 15 is a timing diagram of clock signals, command signals and data signals to be provided to a portion of dies in a write operation, in accordance with an embodiment of the present disclosure. For example, write latency WL may be three clock cycles (WL=3) in FIG. 15. FIG. 16 is a block diagram of an HBM 160 in a semiconductor device in accordance with an embodiment of the present disclosure. For example, the HBM 160 may be the HBM 1. An I/F die 162 receives column command/address signals C[7:0] conveying a column command (e.g., a write command) at time T0 and provides C_0[7:0] to a core die Core1 163a. The I/F die 162 may also receive data signals DQ at time T3 with the WL. For example, the I/F die 162 may include a command decoder 164a (e.g., in the IF command circuit 823). Responsive to the write command, the command decoder 164a may provide a control signal wrtcom with the WL from the write command. Responsive to the wrtcom signal, a clock signal rwclk_0 and data signals DQ_0 may be provided to a core die Core1 163a. The clock signal rwclk_0 may be used while receiving the DQ_0 signals. For example, the core die Core1 163a may include a command decoder 164b (e.g., in the command circuit 833a). Responsive to the C_0[7:0] signals, the command decoder 164b may provide a control signal wrtcomc. Another write command may follow immediately after the write command at T2, before time T3. The command decoder 164b may capture an SID from the C_0[7:0] soon after at time T0, prior to receiving the DQ_0 signals at around time T3.

Figure 17:
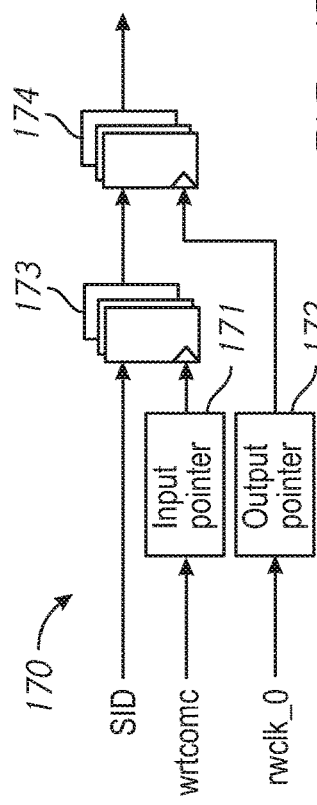
FIG. 17 a block diagram of a write SID counter in a core die, in accordance with an embodiment of the present disclosure.
Figure 18:
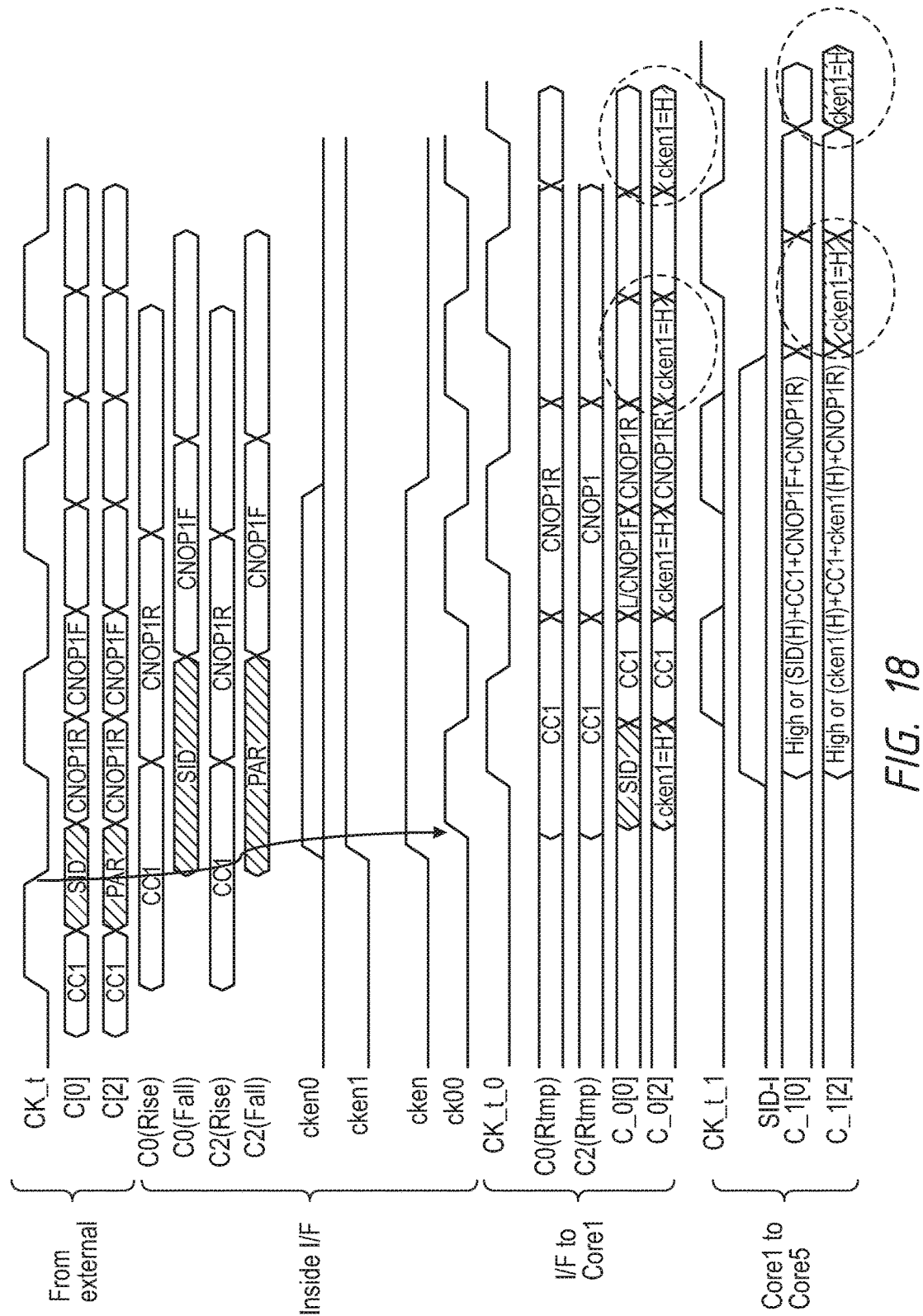
FIG. 18 is a timing diagram of clock related signals and column command signals in the HBM in FIG. 8, in accordance with an embodiment of the present disclosure.

The core die Core1 163a may include a write SID counter 165b. FIG. 17 a block diagram of a write SID counter 170 in a core die, in accordance with an embodiment of the present disclosure. The write SID counter 170 which may function like a first-in-first-out (FIFO) memory may be used as the write SID counter 165b, for example. The write SID counter 170 may include an input pointer 171 and an output pointer 172. The input pointer 171 receives the control signal wrtcomc from a command decoder (e.g., the command decoder 164b). The output pointer 172 receives the rwclk_0 signal from the I/F die (e.g., the I/F die 162). As shown in FIG. 15, the wrtcomc signal may be activated for each write command at times T0 and T2, thus the input pointer 171 may increase a count to 1 responsive to the write command at time T0, and may further increase the count to 2 responsive to the write command at time T2. As shown in FIG. 15, the rwclk_0 signal may be activated with the WL at times T3 and T4. The output pointer 172 may increase a count from 1 to 2 at time T3 and may further increase the count to 3 at time T4 responsive to the rwclk_0 signal. The write SID counter 170 may include flip-flops 173 and 174. The flip-flops 173 receive an SID at a data input and an output signal of the input pointer 171 at a clock input. Responsive to the SID indicative of a stack group of an upper core die (e.g., a core die Core5 163e), the flip-flops 173 may provide the SID at timings responsive to the output signal of the input pointer 171. The flip-flops 174 receive an output signal of the flip-flops 173 at a data input and an output signal of the output pointer 172 at a clock input. Responsive to the output signal of the flip-flops 173, the flip-flops 174 may provide the output signal of the flip-flops 173 at timings responsive to the output signal of the output pointer 172. FIG. 18 is a timing diagram of clock related signals and column command signals in the HBM in FIG. 8, in accordance with an embodiment of the present disclosure. Unlike in FIGS. 12A and 12B, C_0[2] and C_1[2] signals in FIG. 18 convey the cken1 at a logic high level at rising edges of third and fourth clock cycles, CK_t_0 and CK_t_1, indicative of using a write SID counter in the core dies. Thus, the SID may be stored for the WL until the DQ_0 is received while receiving consecutive commands and transmissions of the C_1[7:0] signals, data signals DQ_1 and a clock signal rwclk_1 to the upper core die may be determined responsive to the timely stored SID.

Logic levels of signals and logic gate combinations used in the embodiments described the above are merely examples. However, in other embodiments, combinations of logic levels of signals and combinations of logic gates other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
a first die;
a second die; and
a third die;
wherein the first die is configured to capture first command information and capture second command information after capturing the first command information, the second command information including a stack identifier, the first die being further configured to provide the second command information and provide the first command information after providing the second command information; and
wherein the second die is configured to capture the second command information and capture the first command information after capturing the second command information, the second die being further configured, when the stack identifier designates the second die, to perform a function based on the first and second command information without providing the first and second command information to the third die, and the second die being further configured, when the stack identifier does not designate the second die, to provide the first and second command information to the third die without performing the function.

2. The apparatus of claim 1, wherein the first, second and third dies are stacked such that the second die is between the first die and the third die.

3. The apparatus of claim 2, wherein the first die is an interface die and each of the second and third dies is a memory core die.

4. The apparatus of claim 1, wherein the third die is configured, when the stack identifier designates the third die, to perform the function based on the first and second command information.

5. The apparatus of claim 1, wherein the second die comprises a gate circuit configured, when the stack identifier designates the second die, to take a close state to prevent the first and second command information from being provided to the third die, the gate circuit being further configured, when the stack identifier does not designate the second die, to take an open state to allow the first and second command to be provided to the third die.

6. The apparatus of claim 5, wherein the second die further comprises a storage circuit configured to temporarily store the stack identifier to cause the gate circuit to take one of the close and open states.

7. The apparatus of claim 5, wherein the gate circuit comprises a plurality of logic gates configured to receive respective bits of the first and second command information.

8. The apparatus of claim 1, wherein the first die is configured to capture the first command information responsive to a first edge of a first clock signal and the second command information responsive to a second edge of the first clock signal, the second edge following the first edge, the first die being configured to provide the second command information responsive to a third edge of a second clock signal and the first command information responsive to a fourth edge of the second clock signal, the fourth edge following the third edge.

9. The apparatus of claim 8, wherein the first edge and the second edge of the first clock signal are a rising edge and a falling edge of the first clock signal, respectively, and the third edge and the fourth edge of the second clock signal are a rising edge and a falling edge of the second clock signal, respectively.

10. The apparatus of claim 8, wherein the first die comprises a delay circuit configured to delay the first clock signal to provide the second clock signal.

11. The apparatus of claim 8, wherein the second die is configured to capture the second command information responsive to the third edge of the second clock signal and first command information responsive to the fourth edge of the second clock signal.

12. The apparatus of claim 11, wherein the second die is configured, when the stack identifier does not designate the second die, to provide the second command information responsive to a fifth edge of a third clock signal and the first command information responsive to a sixth edge of the third clock signal, the sixth edge following the fifth edge.

13. A method comprising:
capturing at an interface die first command information;
capturing at the interface die second command information after capturing the first command information, the second command information including a stack identifier;
providing from the interface die to a first core die the second command information;
providing from the interface die to the first core die the first command information after providing the second command information;
causing, when the stack identifier designates the first core die, the first core die to perform a function based on the first and second command information without providing the first and second command information to a second core die; and causing, when the stack identifier does not designate the first core die, the first core die to provide the first and second command information to the second core die without performing at the first die the function based on the first and second command information.

14. The method of claim 13, further comprising stacking the interface die, the first core die and the second die such that the first core die is between the interface die and the second core die.

15. The method of claim 14, further comprising causing, when the stack identifier does not designate the first core die, the second core die to perform the function based on the first and second command information.

16. The method of claim 13,
wherein the capturing the first command information comprises causing the interface die to capture the first command information responsive to a first edge of a first clock signal;
wherein the capturing the second command information comprises causing the interface die to capture the second command information responsive to a second edge of the first clock signal, the second edge following the first edge;
wherein the providing the second command information comprises causing the interface die to provide the second command information to the first core die responsive to a third edge of a second clock signal; and
wherein the providing the first command information comprises causing the interface die to provide the first command information to the first core die responsive to a fourth edge of the second clock signal, the fourth edge following the third edge.

17. The method of claim 16, wherein the first edge and the second edge of the first clock signal are a rising edge and a falling edge of the first clock signal, respectively, and the third edge and the fourth edge of the second clock signal are a rising edge and a falling edge of the second clock signal, respectively.

18. The method of claim 17, further comprising delaying the first clock signal to provide the second clock signal.

19. The method of claim 13, further comprising:
capturing at the first core die the second command information; and
capturing at the first core die the first command information after capturing the second command information.

20. The method of claim 19, wherein causing the first core die to provide the first and second command information to the second core die comprises:
causing the first core die to provide the second command information to the second core die; and
causing the first core die to provide the first command information to the second core die after providing the second command information.

* * * * *